US012769204B2

(12) United States Patent
Zi et al.

(10) Patent No.: US 12,769,204 B2
(45) Date of Patent: Oct. 20, 2026

(54) PHOTO LIGAND DESIGN FOR EUV OR E-BEAM METALLIC PHOTORESISTS

(71) Applicant: Taiwan Semiconductor Manufacturing Co., Ltd., Hsinchu (TW)

(72) Inventors: An-Ren Zi, Hsinchu (TW); Yen-Yu Kuo, Hsinchu (TW); Ching-Yu Chang, Hsinchu (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 639 days.

(21) Appl. No.: 18/335,852

(22) Filed: Jun. 15, 2023

(65) Prior Publication Data

US 2024/0419069 A1 Dec. 19, 2024

(51) Int. Cl.

| | |
|---|---|
| ***G03F 7/004*** | (2006.01) |
| ***G03F 7/075*** | (2006.01) |
| ***G03F 7/16*** | (2006.01) |
| ***G03F 7/20*** | (2006.01) |
| ***G03F 7/32*** | (2006.01) |
| ***G03F 7/38*** | (2006.01) |

(52) U.S. Cl.

CPC .......... *G03F 7/0042* (2013.01); *G03F 7/0755* (2013.01); *G03F 7/167* (2013.01); *G03F 7/2004* (2013.01); *G03F 7/325* (2013.01); *G03F 7/38* (2013.01)

(58) Field of Classification Search

CPC .......... G03F 7/0042; G03F 7/043; G03F 7/38; G03F 7/2004

See application file for complete search history.

(56) References Cited

U.S. PATENT DOCUMENTS

| | | | | |
|---|---|---|---|---|
| 2015/0079393 | A1* | 3/2015 | Freedman | G03F 7/0042 546/10 |
| 2015/0192851 | A1* | 7/2015 | Yamashita | G03F 7/0042 430/296 |
| 2016/0147156 | A1* | 5/2016 | Yoshino | G03F 7/2041 430/311 |
| 2019/0384171 | A1* | 12/2019 | Zi | G03F 7/322 |
| 2021/0109442 | A1* | 4/2021 | Moon | C07F 7/2224 |
| 2022/0163889 | A1* | 5/2022 | Chen | H01L 21/0276 |

FOREIGN PATENT DOCUMENTS

| | | | |
|---|---|---|---|
| TW | 201842080 | A | 12/2018 |
| WO | 2022130796 | A1 | 6/2022 |

OTHER PUBLICATIONS

Cordonier et al., dated Feb. 11, 2011, "Photoacid Generating Ligands for Development of Positive-Tone Directly Photopatternable Metal Complexes", Komaki City, Japan, 8 pages.

* cited by examiner

*Primary Examiner* — John S. Chu

(74) *Attorney, Agent, or Firm* — Seed Intellectually Property Law Group LLP

(57) ABSTRACT

A method for forming a semiconductor device is provided. The method includes forming a photoresist layer comprising an organometallic compound over a substrate. The organometallic compound includes a metal core, at least one hydrolyzable ligand bonded to the metal core, and at least one photoacid generator ligand bonded to the metal core. The method further includes selectively exposing the photoresist layer to radiation and developing the photoresist layer to form a pattern in the photoresist layer.

20 Claims, 10 Drawing Sheets

PHOTO LIGAND DESIGN FOR EUV OR E-BEAM METALLIC PHOTORESISTS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
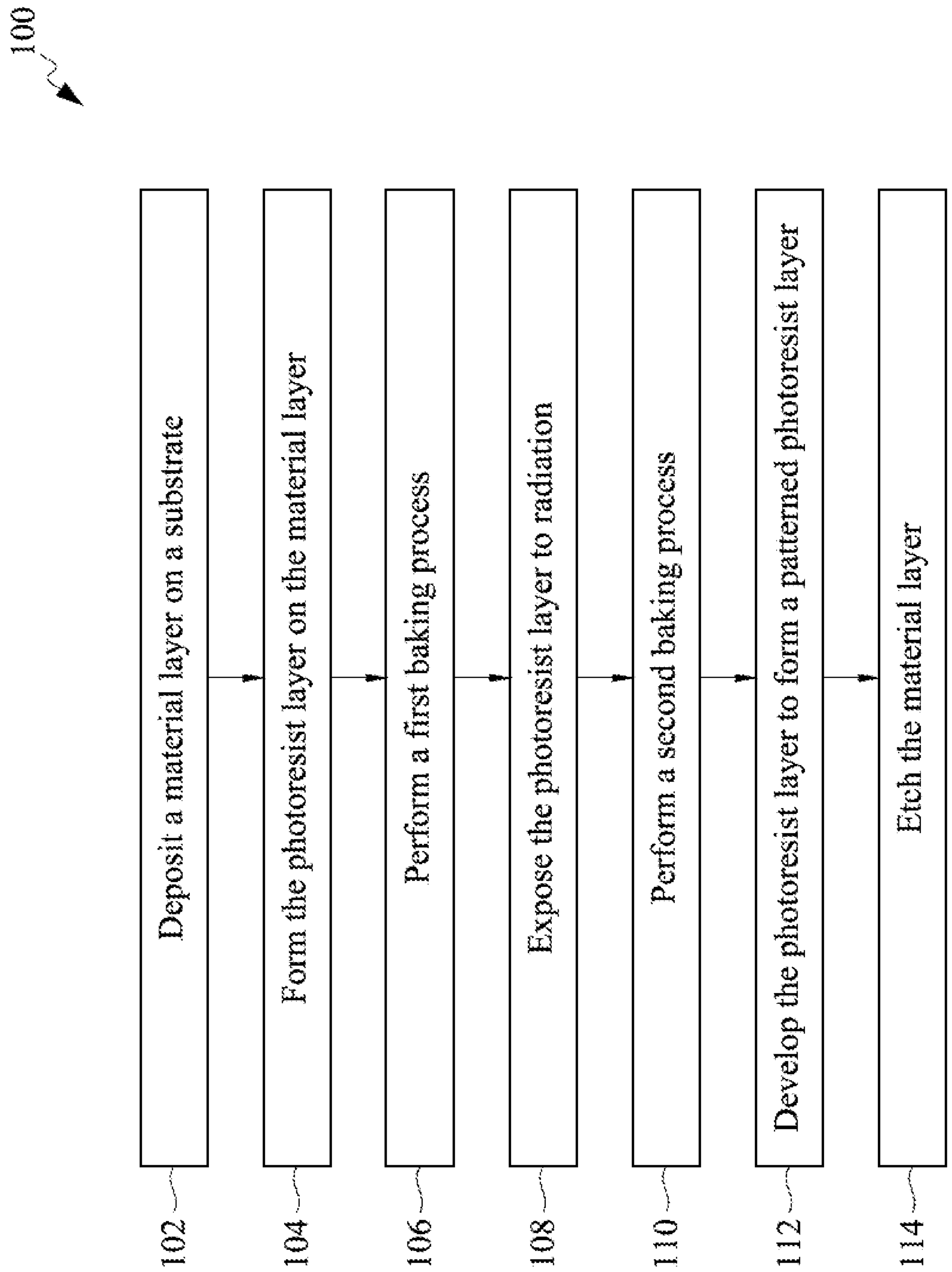
FIG. 1 is a flow chart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Alkyl" refers to a straight or branched hydrocarbon chain group consisting solely of carbon and hydrogen atoms, which is saturated or unsaturated (i.e., contains one or more double and/or triple bonds), having from one to twelve carbon atoms (C1-C12 alkyl), preferably one to eight carbon atoms (C1-C8 alkyl) or one to six carbon atoms (C1-C6 alkyl), and which is attached to the rest of the molecule by a single bond, e.g., methyl, ethyl, n-propyl, 1-methylethyl (iso-propyl), n-butyl, n-pentyl, 1,1-dimethylethyl (t-butyl), 3-methylhexyl, 2-methylhexyl, and the like. Unless stated otherwise specifically in the specification, alkyl groups are optionally substituted.

"Alkylene" refers to a straight or branched divalent hydrocarbon chain linking the rest of the molecule to a substituent group, consisting solely of carbon and hydrogen, which is saturated or unsaturated (i.e., contains one or more double and/or triple bonds), and having from one to twelve carbon atoms, e.g., methylene, ethylene, propylene, n-butylene, and the like. The alkylene chain is attached to the rest of the molecule through a single or double bond and to the substituent group through a single or double bond. The points of attachment of the alkylene chain to the rest of the molecule and to the substituent group can be through one carbon or any two carbons within the chain. Unless stated otherwise specifically in the specification, an alkylene chain may be optionally substituted.

"Alkynylene" refers to a straight or branched divalent hydrocarbon chain linking the rest of the molecule to a radical group, consisting solely of carbon and hydrogen, containing at least one carbon-carbon triple bond and having from two to twelve carbon atoms, e.g., ethynylene, propynylene, n-butynylene, and the like. The alkynylene chain is attached to the rest of the molecule through a single bond and to the radical group through a double bond or a single bond. The points of attachment of the alkynylene chain to the rest of the molecule and to the radical group can be through one carbon or any two carbons within the chain. Unless stated otherwise specifically in the specification, alkynylene is optionally substituted.

"Alkoxy" refers to a group of the formula —$OR_a$ where $R_a$ is an alkyl group as defined above containing one to twelve carbon atoms. Unless stated otherwise specifically in the specification, an alkoxy group may be optionally substituted.

"Aryl" refers to a hydrocarbon ring system group comprising hydrogen, 6 to 18 carbon atoms and at least one aromatic ring. For purposes of this invention, the aryl group may be a monocyclic, bicyclic, tricyclic or tetracyclic ring system, which may include fused or bridged ring systems. Aryl groups include, but are not limited to, aryl groups derived from aceanthrylene, acenaphthylene, acephenanthrylene, anthracene, azulene, benzene, chrysene, fluoranthene, fluorene, as-indacene, s-indacene, indane, indene, naphthalene, phenalene, phenanthrene, pleiadene, pyrene, and triphenylene. Unless stated otherwise specifically in the specification, the term "aryl" or the prefix "ar-" (such as in "aralkyl") is meant to include aryl groups that are optionally substituted.

"Arylene" refers to a divalent group derived from an aryl group as defined herein. The disclosure includes compounds having one or more arylene groups. In some embodiments, an arylene is a divalent group derived from an aryl group by removal of hydrogen atoms from two intra-ring carbon atoms of an aromatic ring of the aryl group. Arylene groups in some compounds function as attaching and/or spacer groups. Arylene groups in some compounds function as chromophore, fluorophore, aromatic antenna, dye and/or imaging groups. Compounds of the disclosure include substituted and/or unsubstituted C5-C30 arylene, C5-C18 arylene and C5-C6 arylene groups.

"Cycloalkyl" refers to a stable non-aromatic monocyclic or polycyclic hydrocarbon group consisting solely of carbon and hydrogen atoms, which may include fused or bridged ring systems, having from three to fifteen carbon atoms, preferably having from three to ten carbon atoms, and which is saturated or unsaturated and attached to the rest of the molecule by a single bond. Monocyclic cycloalkyl groups include, for example, cyclopropyl, cyclobutyl, cyclopentyl, cyclohexyl, cycloheptyl, and cyclooctyl. Polycyclic cycloalkyl groups include, for example, adamantyl, norbornyl, decalinyl, 7,7-dimethyl-bicyclo[2.2.1]heptanyl, and the like. Unless otherwise stated specifically in the specification, a cycloalkyl group may be optionally substituted.

"Cycloalkylene" refers to a divalent group derived from a cycloalkyl group as defined herein. The disclosure includes compounds having one or more cycloalkylene groups. Cycloalkyl groups in some compounds function as attaching and/or spacer groups. Compounds of the disclosure may have substituted and/or unsubstituted C3-C30 cycloalkylene, C3-C18 cycloalkylene and C3-C6 cycloalkylene groups.

"Halo" or "halogen" refers to bromo, chloro, fluoro or iodo.

"Haloalkyl" refers to an alkyl group, as defined above, that is substituted by one or more halo groups, as defined above, e.g., trifluoromethyl, difluoromethyl, trichloromethyl, 2,2,2-trifluoroethyl, 1,2-difluoroethyl, 3-bromo-2-fluoropropyl, 1,2-dibromoethyl, and the like. Unless stated otherwise specifically in the specification, a haloalkyl group may be optionally substituted.

"Heteroaryl" refers to a 5- to 14-membered ring system group comprising hydrogen atoms, one to thirteen carbon atoms, one to six heteroatoms selected from the group consisting of nitrogen, oxygen and sulfur, and at least one aromatic ring. For purposes of this invention, the heteroaryl group may be a monocyclic, bicyclic, tricyclic or tetracyclic ring system, which may include fused or bridged ring systems; and the nitrogen, carbon or sulfur atoms in the heteroaryl group may be optionally oxidized; the nitrogen atom may be optionally quaternized. Examples include, but are not limited to, azepinyl, acridinyl, benzimidazolyl, benzothiazolyl, benzindolyl, benzodioxolyl, benzofuranyl, benzooxazolyl, benzothiazolyl, benzothiadiazolyl, benzo[b][1,4]dioxepinyl, 1,4-benzodioxanyl, benzonaphthofuranyl, benzoxazolyl, benzodioxolyl, benzodioxinyl, benzopyranyl, benzopyranonyl, benzofuranyl, benzofuranonyl, benzothienyl (benzothiophenyl), benzotriazolyl, benzo[4,6]imidazo[1,2-a]pyridinyl, carbazolyl, cinnolinyl, dibenzofuranyl, dibenzothiophenyl, furanyl, furanonyl, isothiazolyl, imidazolyl, indazolyl, indolyl, indazolyl, isoindolyl, indolinyl, isoindolinyl, isoquinolyl, indolizinyl, isoxazolyl, naphthyridinyl, oxadiazolyl, 2-oxoazepinyl, oxazolyl, oxiranyl, 1-oxidopyridinyl, 1-oxidopyrimidinyl, 1-oxidopyrazinyl, 1-oxidopyridazinyl, 1-phenyl-1H-pyrrolyl, phenazinyl, phenothiazinyl, phenoxazinyl, phthalazinyl, pteridinyl, purinyl, pyrrolyl, pyrazolyl, pyridinyl, pyrazinyl, pyrimidinyl, pyridazinyl, quinazolinyl, quinoxalinyl, quinolinyl, quinuclidinyl, isoquinolinyl, tetrahydroquinolinyl, thiazolyl, thiadiazolyl, triazolyl, tetrazolyl, triazinyl, and thiophenyl (i.e., thienyl). Unless stated otherwise specifically in the specification, a heteroaryl group may be optionally substituted.

"Heteroarylene" refers to a divalent group derived from a heteroaryl group as defined herein. The disclosure includes compounds having one or more heteroarylene groups. In some embodiments, a heteroarylene is a divalent group derived from a heteroaryl group by removal of hydrogen atoms from two intra-ring carbon atoms or intra-ring nitrogen atoms of a heteroaromatic or aromatic ring of the heteroaryl group. Heteroarylene groups in some compounds function as attaching and/or spacer groups. Heteroarylene groups in some compounds function as chromophore, aromatic antenna, fluorophore, dye and/or imaging groups. Compounds of the disclosure include substituted and/or unsubstituted C5-C30 heteroarylene, C5-C18 heteroarylene and C5-C6 heteroarylene groups.

"Heteroatomic" in reference to a "heteroatomic linker" refers to a linker group consisting of one or more heteroatoms. Exemplary heteroatomic linkers include single atoms selected from the group consisting of O, N, P and S, and multiple heteroatoms for example a linker having the formula $—S(O^-)(═O)O—$ or $—OS(O^-)(═O)O—$ and multimers and combinations thereof.

"Sulfonate" refers to the $—OS(O)_2R_a$ group, wherein $R_a$ is alkyl or aryl. Unless stated otherwise specifically in the specification, a sulfonate group may be optionally substituted.

The term "substituted" used herein means any of the above groups (i.e., alkyl, alkylene, alkoxy, alkylamino, amide, aryl, cycloalkyl, etc.) wherein at least one hydrogen atom is replaced by a bond to a non-hydrogen atoms such as, but not limited to: a halogen atom such as F, Cl, Br, and I; an oxygen atom in groups such as hydroxyl groups, alkoxy groups, and ester groups; a sulfur atom in groups such as thiol groups, thioalkyl groups, sulfone groups, sulfonyl groups, and sulfoxide groups; a nitrogen atom in groups such as amines, amides, alkylamines, dialkylamines, arylamines, alkylarylamines, diarylamines, N-oxides, imides, and enamines; a silicon atom in groups such as trialkylsilyl groups, dialkylarylsilyl groups, alkyldiarylsilyl groups, and triarylsilyl groups; and other heteroatoms in various other groups. "Substituted" also means any of the above groups in which one or more hydrogen atoms are replaced by a higher-order bond (e.g., a double- or triple-bond) to a heteroatom such as oxygen in oxo, carbonyl, carboxyl, and ester groups; and nitrogen in groups such as imines, oximes, hydrazones, and nitriles. For example, "substituted" includes any of the above groups in which one or more hydrogen atoms are replaced with $—NR_gR_h$, $—NR_gC(═O)R_h$, $—NR_gC(═O)NR_gR_h$, $—NR_gC(═O)OR_h$, $—NR_gSO_2R_h$, $—OC(═O)NR_gR_h$, $—OR_g$, $—SR_g$, $—SOR_g$, $—SO_2R_g$, $—OSO_2R_g$, $—SO_2OR_g$, $═NSO_2R_g$, and $—SO_2NR_gR_h$. "Substituted also means any of the above groups in which one or more hydrogen atoms are replaced with $—C(═O)R_g$, $—C(═O)OR_g$, $—C(═O)NR_gR_h$, $—CH_2SO_2R_g$, $—CH_2SO_2NR_gR_h$. In the foregoing, $R_g$ and $R_h$ are the same or different and independently hydrogen, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, N-heteroaryl and/or heteroarylalkyl. "Substituted" further means any of the above groups in which one or more hydrogen atoms are replaced by a bond to an amino, cyano, hydroxyl, imino, nitro, oxo, thioxo, halo, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, N-heteroaryl and/or heteroarylalkyl group. In addition, each of the foregoing substituents may also be optionally substituted with one or more of the above substituents.

IC fabrication uses one or more photolithography processes to transfer geometric patterns to a film or substrate. Geometric shapes and patterns on a semiconductor make up the complex structures that allow the dopants, electrical properties and wires to complete a circuit and fulfill a technological purpose. In a photolithography process, a photoresist is applied as a thin film to a substrate, and subsequently exposed to one or more types of radiation or light through a photomask. The photomask contains clear and opaque features that define a pattern which is to be created in the photoresist layer. Areas in the photoresist exposed to light transmitted through the photomask are made either soluble or insoluble in a specific type of solution known as a developer. In the case when the exposed regions are soluble, a positive image of the photomask is produced in the photoresist and this type of photoresist is called a positive photoresist. On the other hand, if the unexposed areas are dissolved by the developer, a negative image results in the photoresist and this type of photoresist is called a negative photoresist. The developer removes the more soluble areas, leaving the patterned photoresist in place. The resist pattern is then used as an etch mask in subsequent etching processes, transferring the pattern to an underlying material layer, thereby replicating the mask pattern in the underlying material layer. Alternatively, the resist pattern is then used as an ion implantation mask in subsequent ion implantation processes applied to the underlying material layer, such as an epitaxial semiconductor layer.

As the semiconductor device sizes continue to shrink, for example, below 20 nanometer nodes, traditional lithography technologies have optical restrictions, which leads to resolution issues and may not achieve the desired lithography performance. In comparison, extreme ultraviolet (EUV) lithography using EUV radiation around 13.5 nm can achieve much smaller device sizes. However, as the decrease in wavelength causes decrease in photo flux, conventional polymer-based photoresists, which suffer from low absorption efficiency to EUV radiation, are no longer suitable for EUV lithography as they require longer exposure time, resulting in reduced throughput and leading to various patterning issues, such as increased line width roughness (LWR) and critical dimension (CD) non-uniformity.

Metallic resists containing metals with high EUV photo absorption have been developed to improve the resist sensitivity to the EUV radiation, thereby lowering exposure doses required for defining the pattern in the photoresist layer. Organometallic compounds having hydrolyzable organic ligands bonded to the metals are used as precursors for EUV photoresist. These hydrolyzable ligands undergo hydrolysis and polycondensation in the lithography processes. Through a series of hydrolysis and condensation reaction, the organometallic compounds form organometallic oxide hydroxide clusters which can be converted into insoluble metal oxide clusters upon radiation. Hydrolysis and condensation of the organometallic compounds helpfully develop a hydrolytically stable metal oxide film.

The present disclosure provides metallic resist materials that allow simultaneously achieving the improvement in LWR and sensitivity for EUV or e-beam lithography. The metallic resist material comprises an organometallic compound including at least two different types of ligands bonded to a metal core, one of which is a hydrolyzable ligand and another of which is a photoacid generator ligand. Upon exposure, acid is generated from the photoacid generator ligand, which functions as a catalyst to promote complete hydrolysis of the hydrolysable ligands and complete polycondensation of the hydrolyzed ligands. As a result, a dose reduction of at least 2% can be achieved when comparing to the organometallic resist containing no photoacid generator ligands. The LWR and CD non-uniformity can also be improved by at least 3%.

FIG. 1 is a flowchart illustrating a method 100 of fabricating a semiconductor device 200, in accordance with some embodiments of the present disclosure. FIGS. 2A through 2F are cross-sectional views of a semiconductor device 200 at various fabrication stages in accordance with some embodiments of the present disclosure. The method 100 is described below in conjunction with FIG. 1 and FIGS. 2A through 2F wherein the semiconductor device 200 is fabricated by using embodiments of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The semiconductor device 200 may be an intermediate structure during the fabrication of an IC, or a portion thereof. The IC may include logic circuits, memory structures, passive components (such as resistors, capacitors, and inductors), and active components such as diodes, field-effect transistors (FETs), metal-oxide semiconductor field effect transistors (MOSFETs), complementary metal-oxide semiconductor (CMOS) transistors, bipolar transistors, high voltage transistors, high frequency transistors, fin-like FETs (FinFETs), other three-dimensional (3D) FETs, and combinations thereof. The semiconductor device 200 may include a plurality of semiconductor devices (e.g., transistors), which may be interconnected.

Figure 2A:
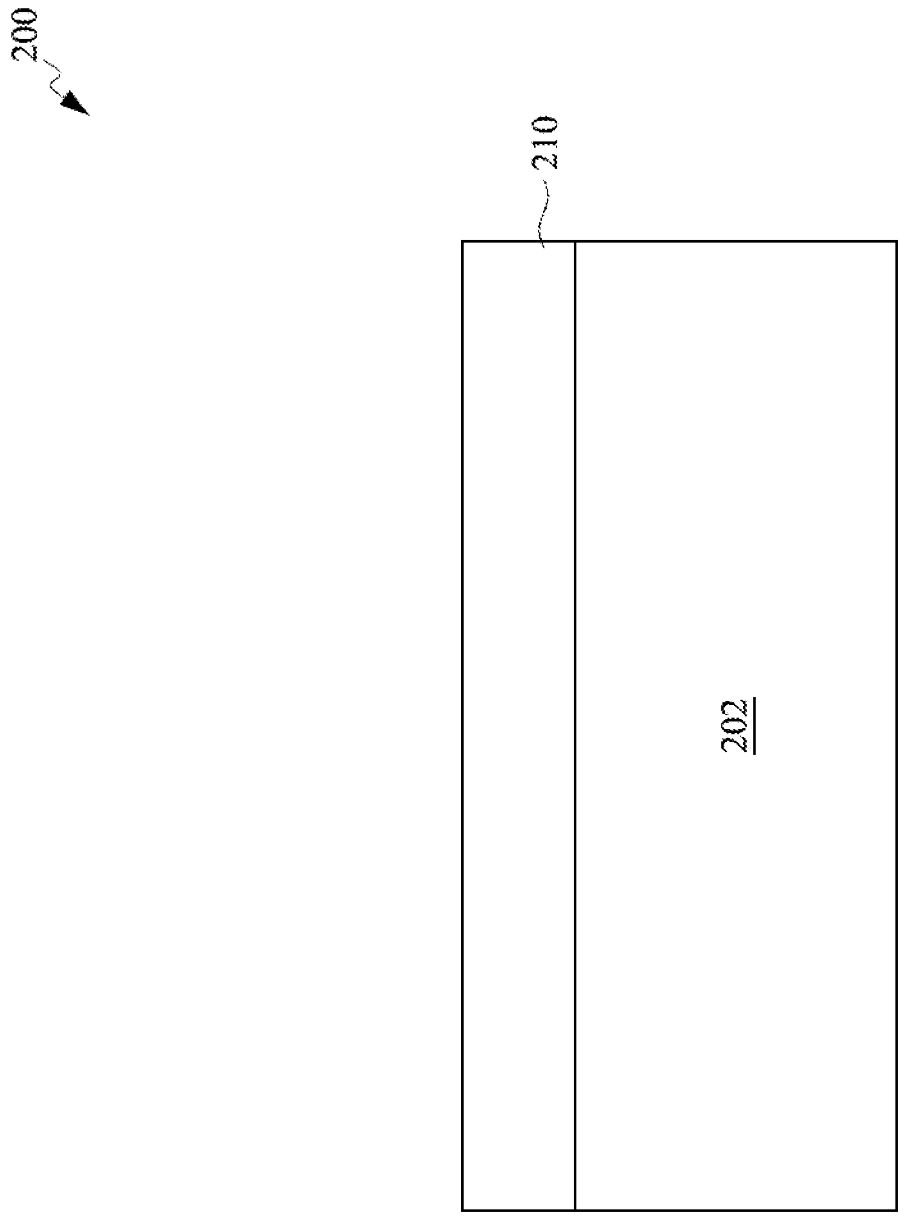
FIGS. 2A-2G are cross-sectional views of a semiconductor device fabricated using the method of FIG. 1, in accordance with some embodiments.

Referring to FIGS. 1 and 2A, the method 100 includes operation 102, in which a material layer 210 is deposited on a substrate 202, in accordance with some embodiments. FIG. 2A is a cross-sectional view of a semiconductor device 200 after depositing the material layer 210 on the substrate 202, in accordance with some embodiments.

In some embodiments, the substrate 202 may be a bulk semiconductor substrate including one or more semiconductor materials. In some embodiments, the substrate 202 may include silicon, silicon germanium, carbon doped silicon (Si:C), silicon germanium carbide, or other suitable semiconductor materials. In some embodiments, the substrate 202 is composed entirely of silicon.

In some embodiments, the substrate 202 may include one or more epitaxial layers formed on a top surface of a bulk semiconductor substrate. In some embodiments, the one or more epitaxial layers introduce strains in the substrate 202 for performance enhancement. For example, the epitaxial layer includes a semiconductor material different from that of the bulk semiconductor substrate, such as a layer of silicon germanium overlying bulk silicon or a layer of silicon overlying bulk silicon geranium. In some embodiments, the epitaxial layer(s) incorporated in the substrate 202 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 202 may be a semiconductor-on-insulator (SOI) substrate. In some embodiments, the SOI substrate includes a semiconductor layer, such as a silicon layer formed on an insulator layer. In some embodiments, the insulator layer is a buried oxide (BOX)

layer including silicon oxide or silicon germanium oxide. The insulator layer is provided on a handle substrate such as, for example, a silicon substrate. In some embodiments, the SOI substrate is formed using separation by implanted oxygen (SIMOX) or other suitable technique, such as wafer bonding and grinding.

In some embodiments, the substrate 202 may also include a dielectric substrate such as silicon oxide, silicon nitride, silicon oxynitride, a low-k dielectric, silicon carbide, and/or other suitable layers.

In some embodiments, the substrate 202 may also include various p-type doped regions and/or n-type doped regions, implemented by a process such as ion implantation and/or diffusion. Those doped regions include n-well, p-well, lightly doped region (LDD) and various channel doping profiles configured to form various IC devices, such as a COMOS transistor, imaging sensor, and/or light emitting diode (LED). The substrate 202 may further include other functional features such as a resistor and/or a capacitor formed in and/or on the substrate 202.

In some embodiments, the substrate 202 may also include various isolation features. The isolation features separate various device regions in the substrate 202. The isolation features include different structures formed by using different processing technologies. For example, the isolation features may include shallow trench isolation (STI) features. The formation of an STI may include etching a trench in the substrate 202 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

In some embodiments, the substrate 202 may also include gate stacks formed by dielectric layers and electrode layers. The dielectric layers may include an interfacial layer and a high-k dielectric layer deposited by suitable techniques, such as chemical vapor deposition (CVD), atomic layer deposition (ALD), physical vapor deposition (PVD), thermal oxidation, combinations thereof, and/or other suitable techniques. The interfacial layer may include silicon dioxide and the high-k dielectric layer may include LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3$(BST), $Al_2O_3$, $Si_3N_4$, SiON, and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. The electrode layer may include Ti, Ag, Al, TiAlN, TaC, TaCN, TaSiN, Mn, Zr, TiN, TaN, Ru, Mo, Al, WN, Cu, W, any suitable materials, and/or a combination thereof.

In some embodiments, the substrate 202 may also include a plurality of inter-level dielectric (ILD) layers and conductive features integrated to form an interconnect structure configured to couple the various p-type and n-type doped regions and the other functional features (such as gate electrodes), resulting in a functional integrated circuit. In one example, the substrate 202 may include a portion of the interconnect structure and the interconnect structure may include a multi-layer interconnect (MLI) structure and an ILD layer integrated with a MLI structure, providing an electrical routing to couple various devices in the substrate 202 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The material layer 210 is disposed on the substrate 202. The material layer 210 is a layer to be processed by the method 100, such as to be pattered or to be implanted. In some embodiments, the material layer 210 is a hard mask layer to be patterned. In some embodiments, the material layer 210 includes a dielectric material such as silicon oxide, silicon nitride, silicon carbide, or silicon oxynitride. In some other embodiments, the material layer 210 includes a metal oxide such as titanium oxide or a metal nitride such as titanium nitride. In some embodiments, the material layer 210 includes a polymer, such as polyimide. In some embodiments, the material layer 210 also serves as an anti-reflection coating (ARC) layer whose composition is chosen to minimize reflectivity of radiation implemented during exposure of the photoresist layer 220. For example, in some embodiments, the material layer 210 includes silicon oxide, silicon oxygen carbide, or plasma enhanced chemical vapor deposited silicon oxide. The material layer 210 may be formed by any suitable process including CVD, PVD, plasma enhanced chemical vapor deposition (PECVD), ALD, or spin coating, and may be formed to any suitable thickness.

Figure 2B:
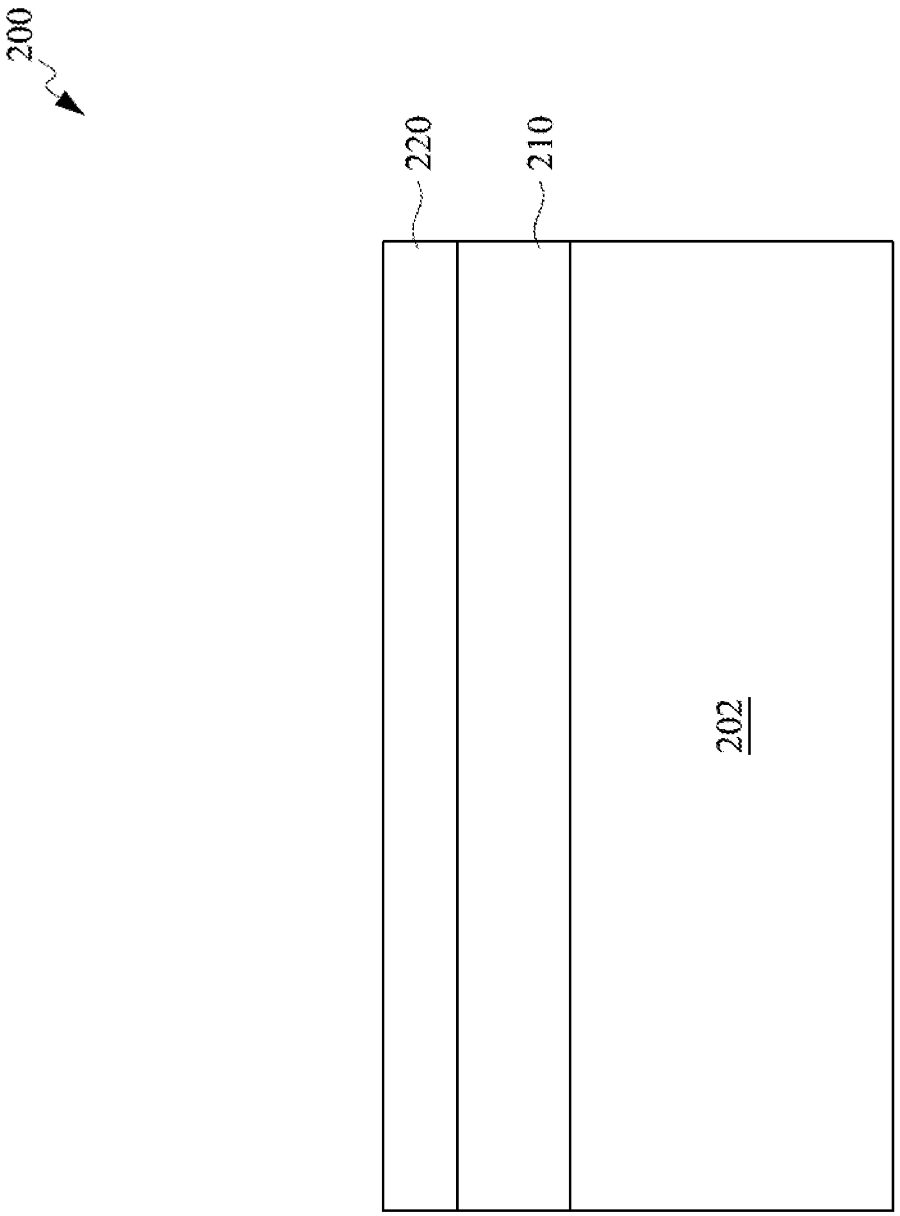

Referring to FIGS. 1 and 2B, the method 100 proceeds to operation 102, in which a resist composition is coated on a surface of the material layer 210 to form a photoresist layer 220, in accordance with some embodiments. FIG. 2B is a cross-sectional view of the semiconductor device 200 after coating the resist composition on the surface of the material layer 210 to provide the photoresist layer, in accordance with some embodiments.

The photoresist layer 220 is photosensitive layer that is patternable by exposure to actinic radiation, such as a DUV radiation (e.g., 248 nm radiation from a KrF laser or 193 nm radiation from an ArF laser), an EUV radiation (e.g., 13.5 nm radiation), an electron beam (e-beam), or an ion beam. In some embodiments, the photoresist layer 220 is patternable under EUV radiation and is usable in an EUV lithography process.

In some embodiments, the resist composition is a metallic resist composition and the photoresist layer is a metallic resist layer. In some embodiments, the resist composition includes an organometallic compound that polymerizes (and/or crosslinks) and subsequently becomes insoluble in a developer after exposure to radiation, for example, EUV or e-beam radiation. In some embodiments, the organometallic compound includes a metal core coordinated with at least two types of ligands, the first type of the ligands comprising at least one hydrolyzable group (also referred to as hydrolyzable ligand) and the second type of the ligands comprising at least one photoacid generator (also referred to as photoacid generator ligand). When the photoresist layer 220 is exposed to actinic radiation, the photoacid generator ligand absorbs the radiation and generates an acid. The generated acid functions as a catalyst promoting hydrolysis of the hydrolyzable ligands and subsequent polycondensation reaction of the hydrolyzed ligands, leading to formation of a polymeric metal oxide in the exposed regions of the photoresist layer 220.

Metallic resists used in EUV and e-beam applications typically do not include photoacid generators (PAGs). In embodiments of the present disclosure, PAGs are introduced as ligands of an organometallic compound to facilitate a complete hydrolysis of the hydrolyzable ligands. As a result, the line width roughness (LWR) and critical dimension (CD) uniformity can both be improved. The inclusion of PAGs as ligands in the metallic resist compound also enables the use of lower exposure doses during the photoresist exposure operation and provide increased yield of semiconductor devices. In some embodiments, comprising to existing organometallic compounds that do not contain a photoacid generator ligand, the metallic resist of the present disclosure helps to improve the LWR and CD uniformity by at least 3%, and to reduce the dose by at least 2%.

Figure 3:
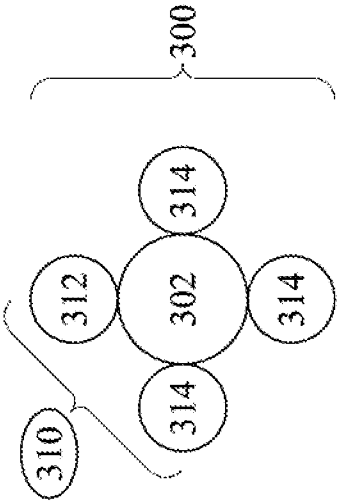
FIG. 3 illustrates an exemplary organometallic compound, in accordance with some embodiments.

FIG. 3 illustrates a schematic structure of an organometallic compound 300, in accordance with some embodiments of the present disclosure. The organometallic compound 300 includes a metal core 302 and a plurality of ligands 310 bonded to the metal core 302 with at least one of the ligands 310 being an photoacid generator ligand 312. It is noted that while the metal core 302 is shown to coordinate with four ligands 310, coordination with less or more ligands is contemplated. Also, while the multiple ligands 310 is shown to include one photoacid generator ligand 312, more than one photoacid generator ligands 312 can be present. A molar concentration ratio of the photoacid generator ligand 312 to metal core is from about 0.01 mol % to 30 mol %. At PAG ligand concentrations below the disclosed range, there may not be a sufficient amount of the PAG to provide a measurable improvement in the resist parameter or performance. At PAG ligand concentrations above the disclosed range, there may not be a significant additional improvement in the resist parameters or performance. The metal core 302 may consist of a single metal ion or a cluster of metal ions. In some embodiments, the metal core 302 consists of 1 to 18 metal ions, with each of which coordinated with 2 to 18 ligands.

In some embodiments, the organometallic compound 300 has the following formula (I):

$$(Q)_x—M_z—(L—G)_y, \qquad (I)$$

wherein:

M is, at each occurrence, a metal element;

Q is, at each occurrence, a hydrolyzable ligand;

G is, at each occurrence, a photoacid generator ligand;

L is, at each occurrence, an optional alkylene, alkenylene, alkynylene, cycloalkylene, arylene, heteroalkylene, heteroalkenylene, heteroalkynylene, heteroarylene or heteroatomic linker;

z is an integer of 1 or greater; and x and y are each independently an integer of 1 or greater, provided that $x+y \leq v$, wherein v is the valency of M.

In some embodiments, M may include a metal having a high EUV absorption. In some embodiments, the metal may have an absorption at EUV wavelengths of at least about 4 $cm^2$/mol, for example, from about 5 $cm^2$/mol to about 9 $cm^2$/mol. Examples of metals having high EUV absorption include, but are not limited to, tin (Sn), hafnium (Hf), zirconium (Zr), silver (Ag), cadmium (Cd), indium (In), antimony (Sb), tellurium (Te), caesium (Cs), gold (Au), barium (Ba), thallium (Tl), bismuth (Bi), and cerium (Ce).

Q is a hydrolyzable ligand operable to hydrolyze in the presence of an acid to produce a hydroxyl (—OH) group. In some embodiments, the hydrolyzable ligand Q may contain an oxygen group (—O—$R^1$) bonded to M, where $R^1$ may be a halogen or a straight or branched, saturated or unsaturated alkyl, alkenyl, cycloalkyl, or aryl group having 1 to 30 carbon atoms, 1 to 20 carbon atoms, or 1 to 12 carbon atoms. Examples of hydrolyzable ligand Q include, but are not limited to, chlorine, bromine, iodine, alkoxy, acyloxy, or carboxyl. In some embodiments, the hydrolyzable ligand Q is selected from methoxy, ethoxy, propoxy, isopropoxy, butoxy, isobutoxy, tert-butoxy, pentyloxy, tert-pentyloxy, neo-pentyloxy, hexyloxy, isohexyloxy, phenoxy, tolyloxy, xylyloxy, acetoxy, and the like.

G is a photoacid generator ligand operable to generate an acid in response to radiation. In some embodiments, the photoacid generator ligand G may include onium salts (e.g., triphenyl sulfonium perfluorosulfonates such as TPS nonaflate, TPS triflate, and substituted forms thereof, such as tris(4-tert-butylphenyl)sulfonium perfluoro-1-butanesulfonate), oxime-sulfonates, triazines, selenium salts, phosphonium salts, iodinium, sulfonium salts, organic halogen compounds, O-nitrobenzylsulfonate compounds, N-iminosulfonate compounds, N-imidosulfonate compounds, sulfonimide compounds, diazodisulfonate compounds, disulfone compounds, or combinations thereof.

In some embodiments, the photoacid generator ligand G includes an anionic photoacid generator. For example, in some embodiments, the anionic photoacid generator ligand G has one of the following structures:

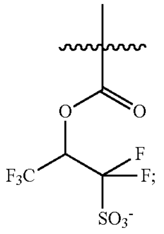

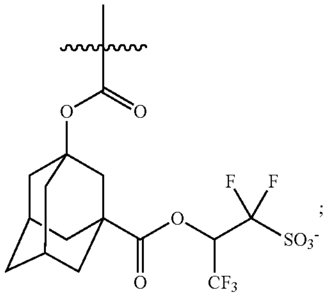

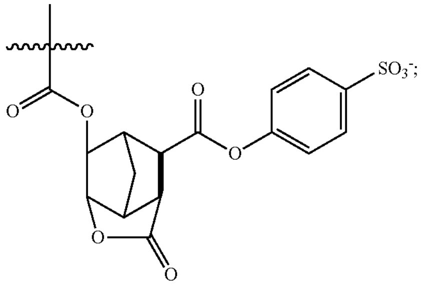

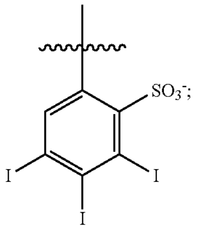

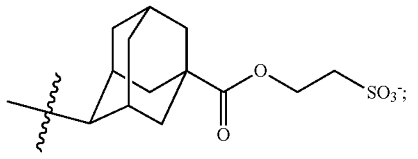

-continued
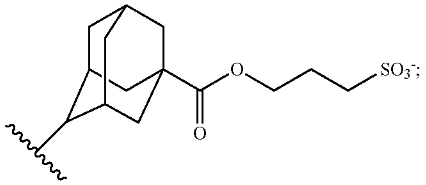
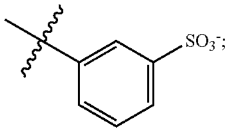
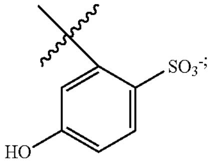
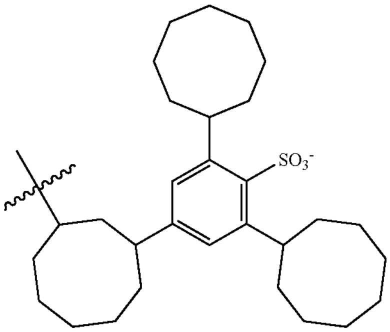
;
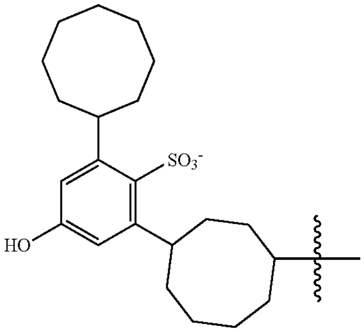
;
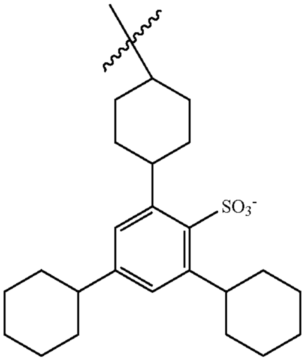
;
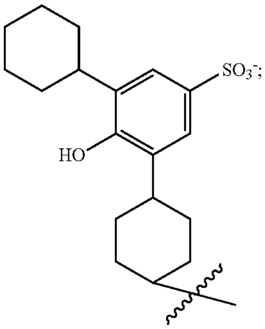
-continued
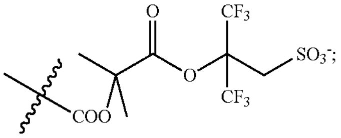
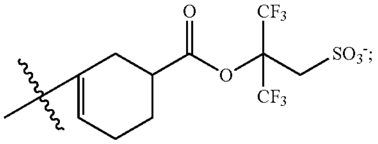
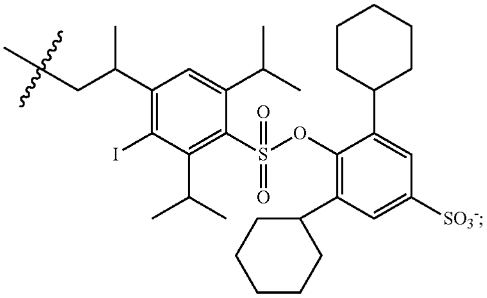
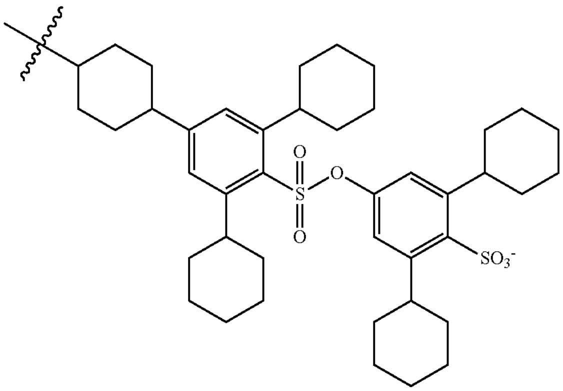
;
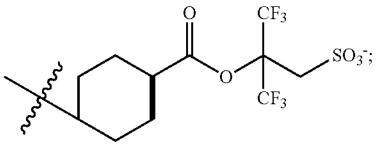
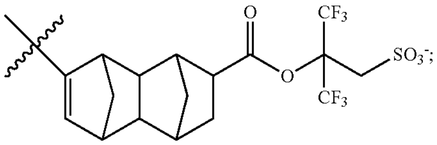
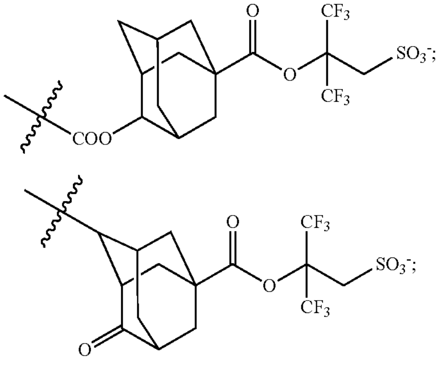

-continued
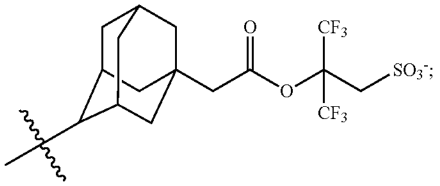
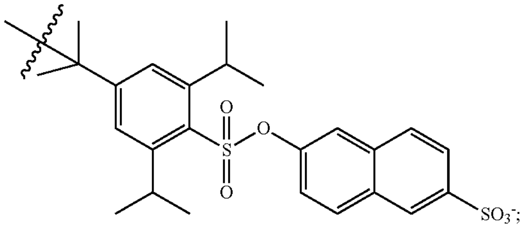
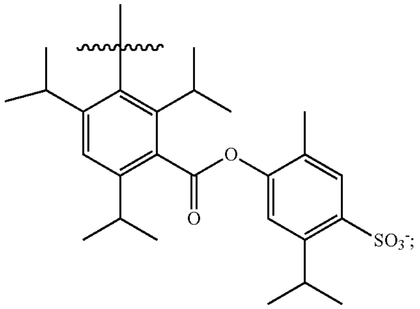
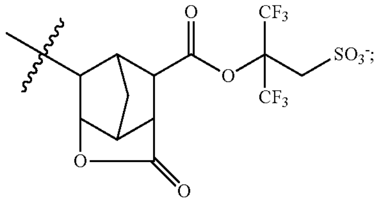
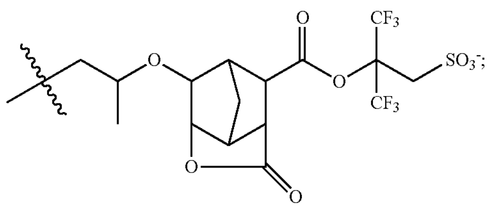
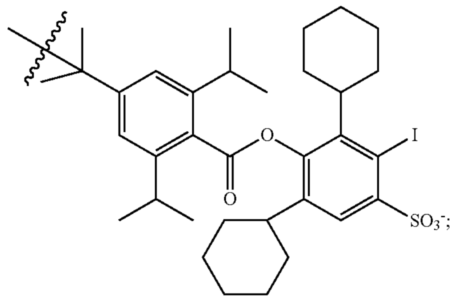
-continued
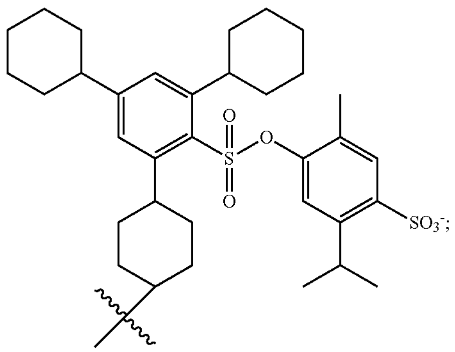
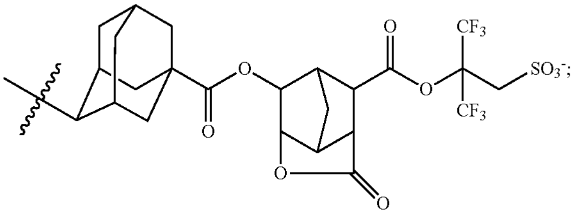
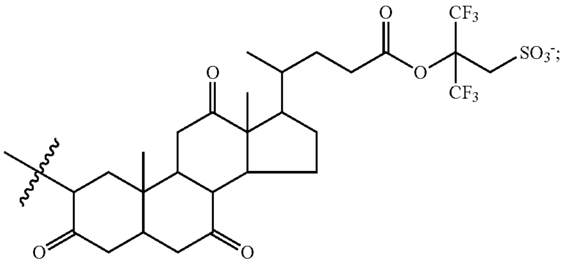
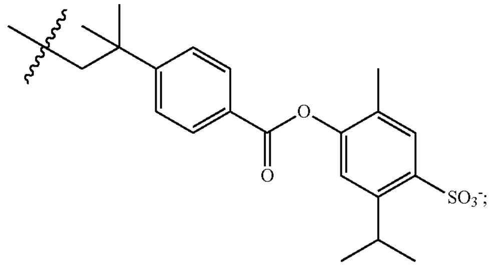
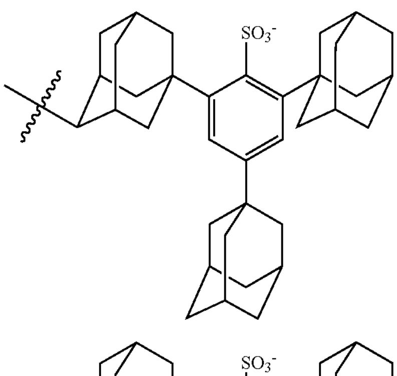
;
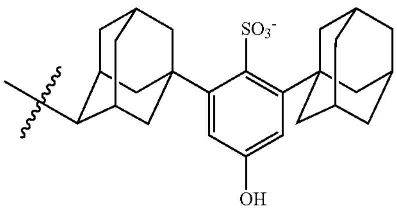
;

-continued
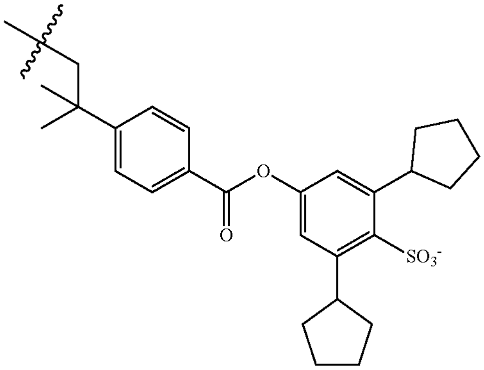
;
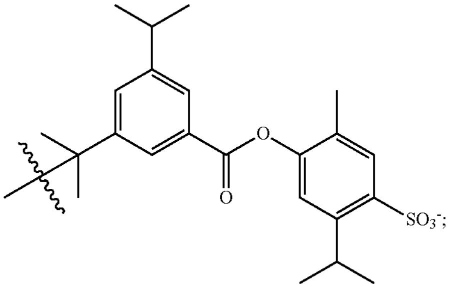
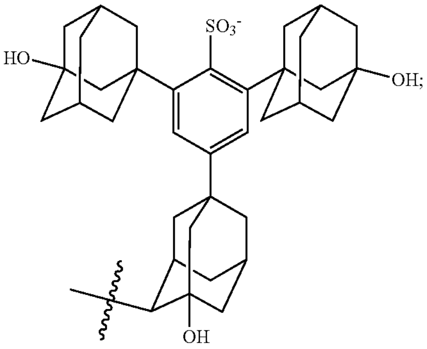
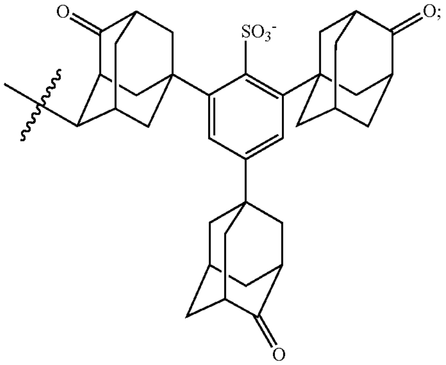
-continued
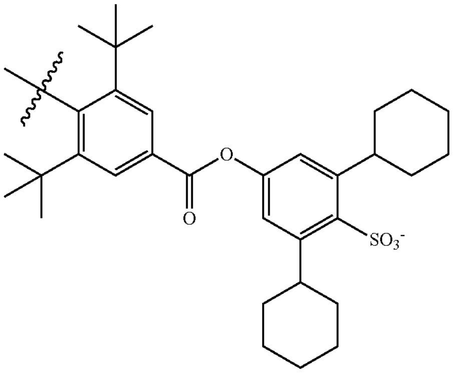
;
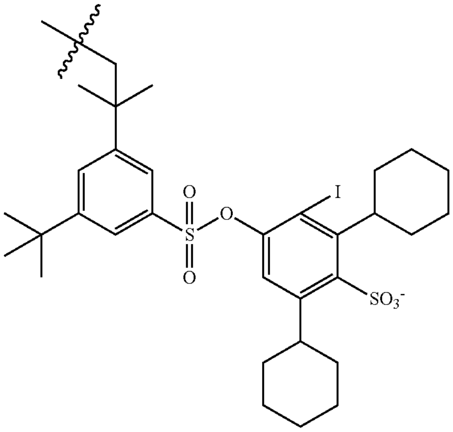
;
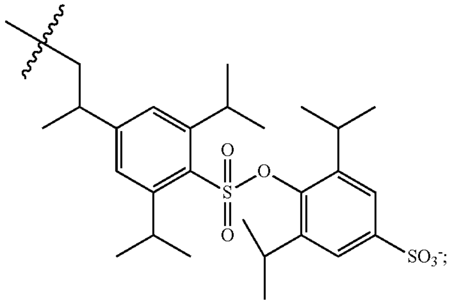
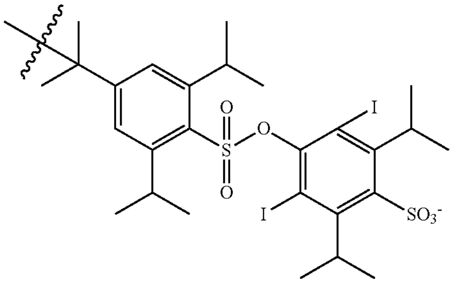
;
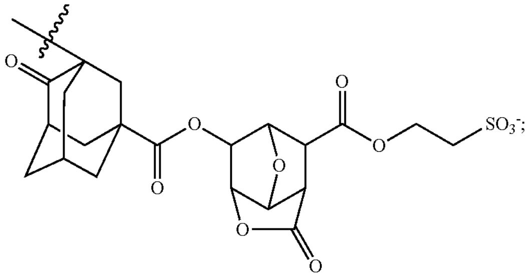

-continued
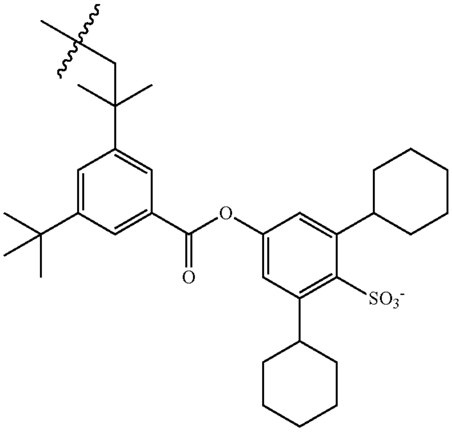
;
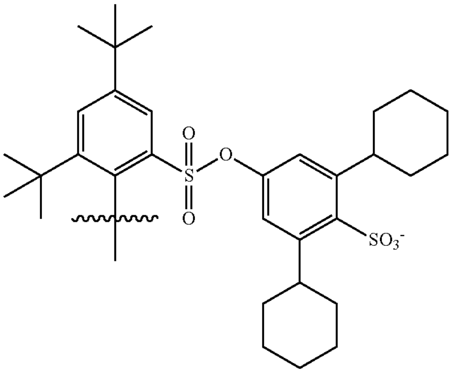
;
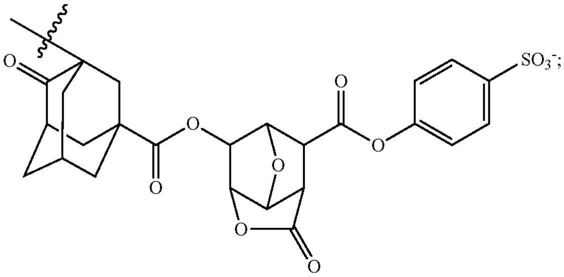
;
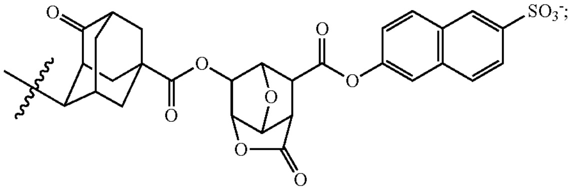
;
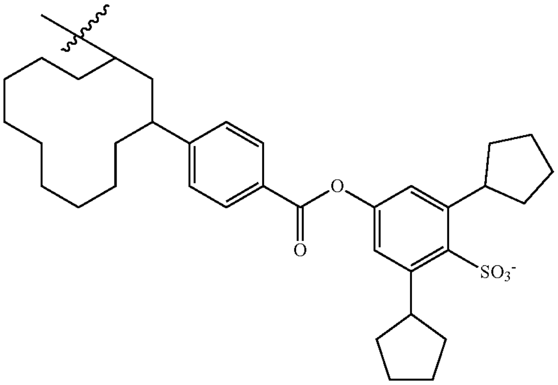
;
-continued
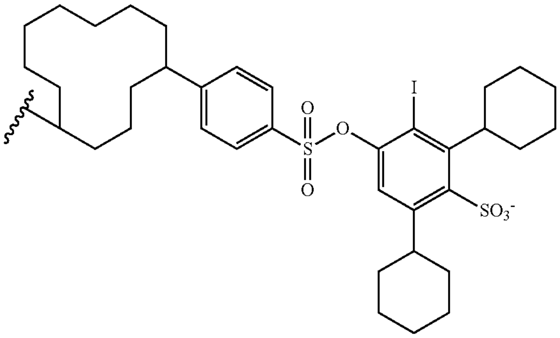
;
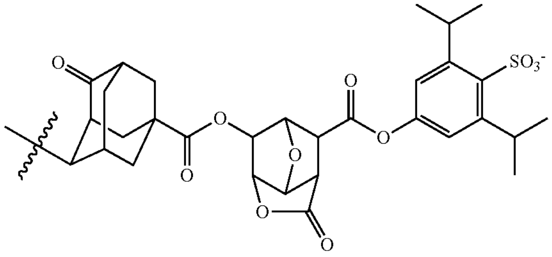
;
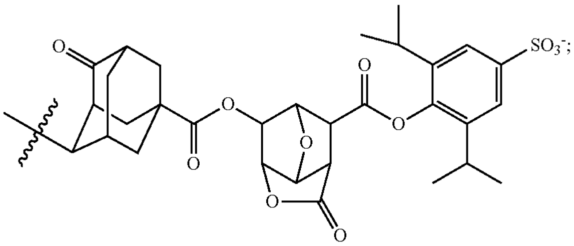
;
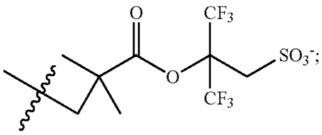
;
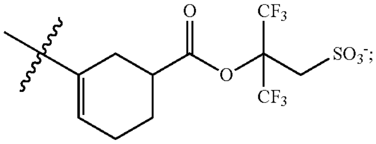
;
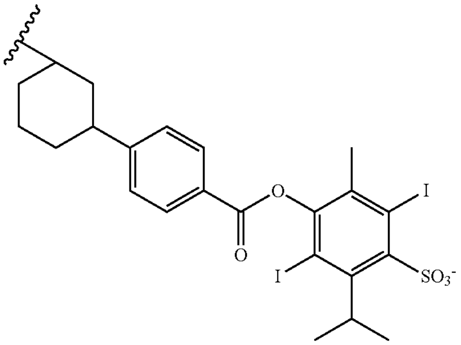
or -continued

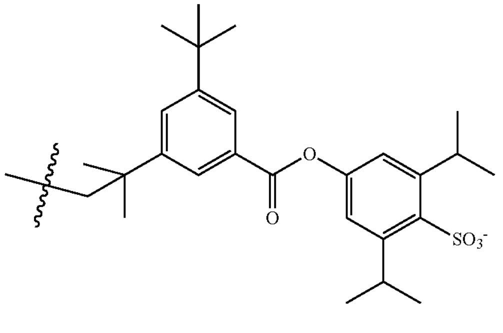

In some embodiments, the photoacid generator ligand G includes an cationic photoacid generator. For example, in some embodiments, the cationic photoacid generator ligand G has one of the following structures:

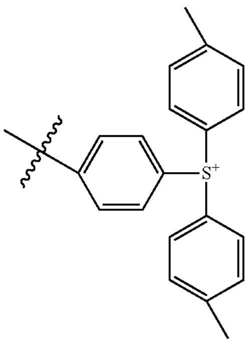
;
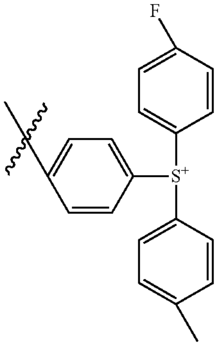
;
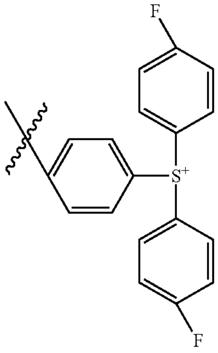
;
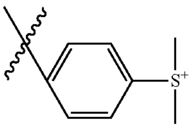
;
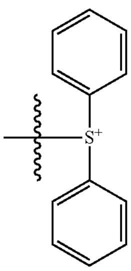
;
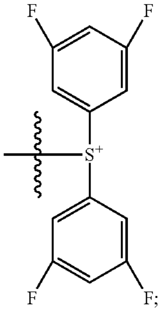

-continued

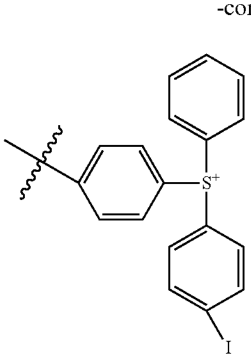
;
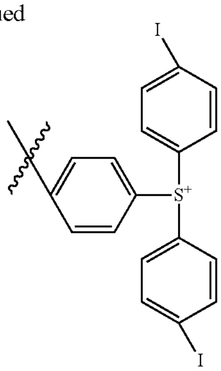
;
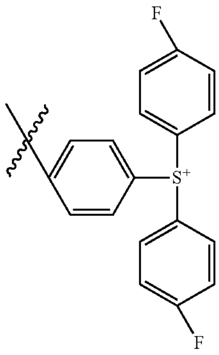
;
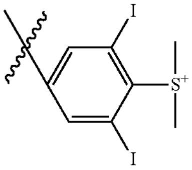
;
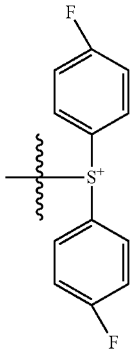
; or
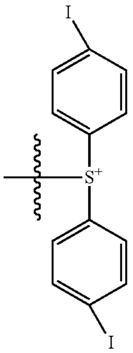
.

In some embodiments, the linker L is absent such that the photoacid generator ligand G is directly bonded to the metal core M. In some embodiments, the photoacid generator ligand G is covalently bonded to the metal core M via the linker L. In some embodiments, the linker L is alkylene, alkenylene, alkynylene, cycloalkylene, arylene, heteroalkylene, heteroalkenylene, heteroalkynylene, heteroarylene or heteroatomic linker. In some embodiments, the linker L comprises —S—, —P—, —$P(O_2)$—, —C(═O)S—, —C(═O)O—, —O—, —N—, —C(═O)N—, —$SO_2O$—, —$SO_2S$—, —SO—, —$SO_2$—, carboxylic acid, ether, ketone, ester, or benzene. In some embodiments, the alkylene, heteroalkylene, cycloalkylene, cycloheteroalkylene, arylene or heteroarylene is substituted with $OR_2$, $NR_2$, F, Cl, Br, I. In some embodiments, $R_2$ is an alkyl group.

z is the number of metal element that constitute the metal core M. In some embodiments, z is from 1 to 18. In some embodiments, z is from 1 to 12. In some embodiments, z is 1 so that the metal core M contains a single metal element. In some embodiments, z is greater than 1 so that the metal core M contains a cluster of multiple metal elements.

In some embodiments, the resist composition also comprises a solvent. In some embodiments, the solvent is one or more of propylene glycol methyl ether acetate (PGMEA), propylene glycol monomethyl ether (PGME), 1-ethoxy-2-propanol, propylene glycol ethyl ether (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), or 2-heptanone (MAK). In some embodiments, the organometallic compound in the resist composition may range from about 1 wt % to about 50 wt % based on a total weight of the resist composition.

The resist composition is then deposited onto the surface of the material layer 210 to form the photoresist layer 220. The resist composition may be deposited using spin coating, CVD, PVD, or ALD. The resulting photoresist layer 220 may have a thickness ranging from about 0.5 nm to about 100 nm.

In some embodiments, after depositing the photoresist layer 220, the surface of the photoresist layer 220 may be treated by, for example, chemicals or oxygen plasma, to change the surface characteristics of the photoresist layer. In some embodiments, the surface of the photoresist layer 220 is treated with water to increase the water content in the photoresist layer 220. In some embodiments, water treatment of the surface of the photoresist layer 220 may be performed by a rinse process. The rinse process includes rinsing the photoresist layer 220 with water or a liquid solution that includes a solvent and water. In some embodiments, the solvent includes propylene glycol methyl ether acetate, propylene glycol methyl ether, butyl acetate, 1-ethoxy-2-propanol, gamma-butyrolactone, cyclohexanone, ethyl lactate, methanol, ethanol, propanol, n-butanol, acetone, dimethylformamide, acetonitrile, isopropyl alcohol, tetrahydrofuran, acetic acid, or combinations thereof. The amount of water added to the liquid solution is also carefully configured. In some embodiments, the water constitutes from about 0.0001% to about 10% of the liquid solution, for example, from about 0.1% to about 5% of the liquid solution. In some embodiments, a water vapor treatment process may be performed, instead of, or in combination with, the rinse process, where the water vapor treatment process applies a water vapor to the photoresist layer 220. It is understood that the performance of the rinse process and/or the water vapor treatment is optional, and can be omitted in some embodiments.

Figure 2C:
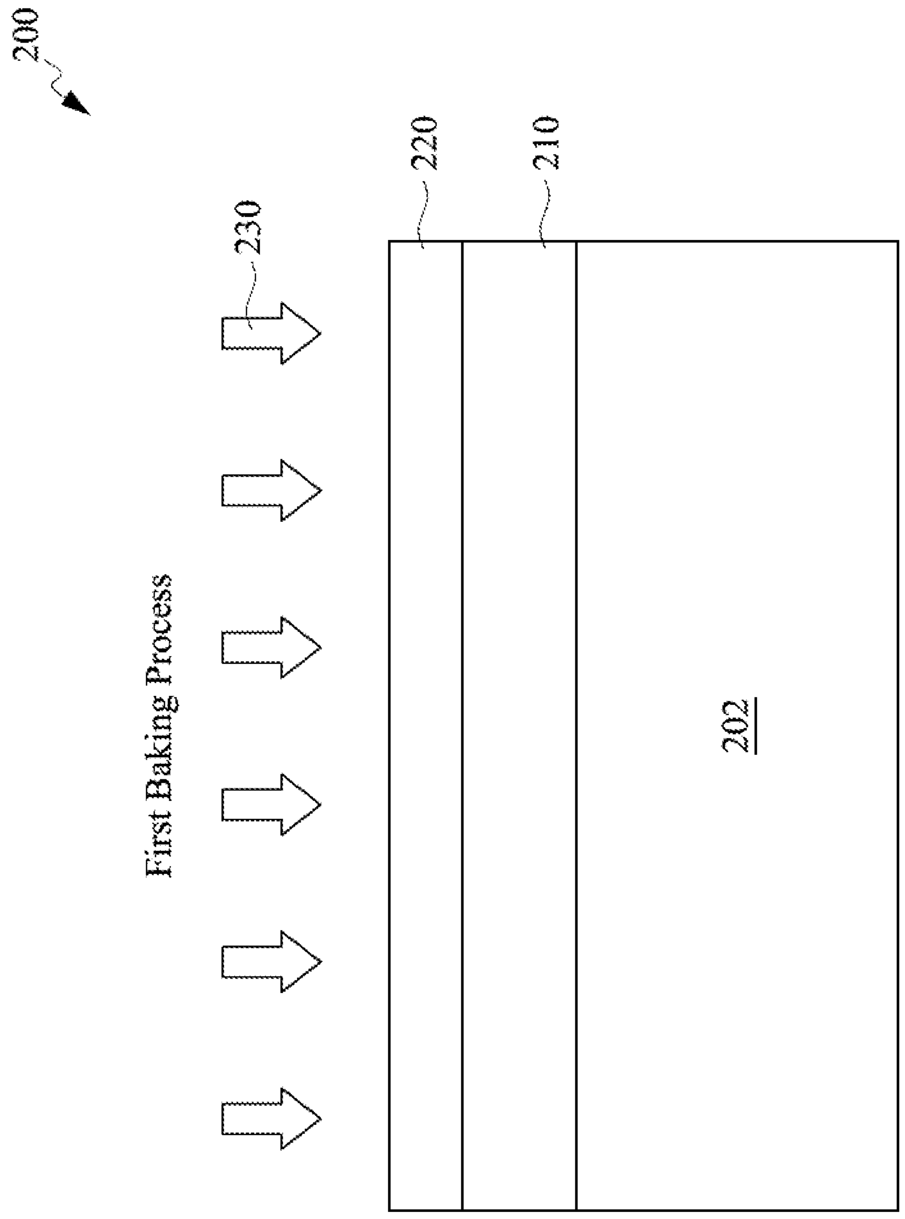

Referring to FIGS. 1 and 2C, the method 100 proceeds to operation 106, in which a first baking process 230 is performed to cure and dry the photoresist layer 220, in accordance with some embodiments. FIG. 2C is a cross-sectional view of the semiconductor device 200 after performing the first baking process 230, in accordance with some embodiments.

Since this first baking process 230 is performed before exposing the photoresist layer 220 to radiation, the first baking process 230 may also be referred to as a pre-exposure-baking process. The curing and drying of the photoresist layer removed the solvent while leaving behind the organometallic compound. In some embodiments, the first baking process 230 is performed at a temperature suitable to evaporate the solvent, such as from about 30° C. to about 120° C. The first baking process 230 is performed for a time sufficient to cure and dry the photoresist layer 220, such as from about 10 seconds to about 10 minutes.

Figure 2D:
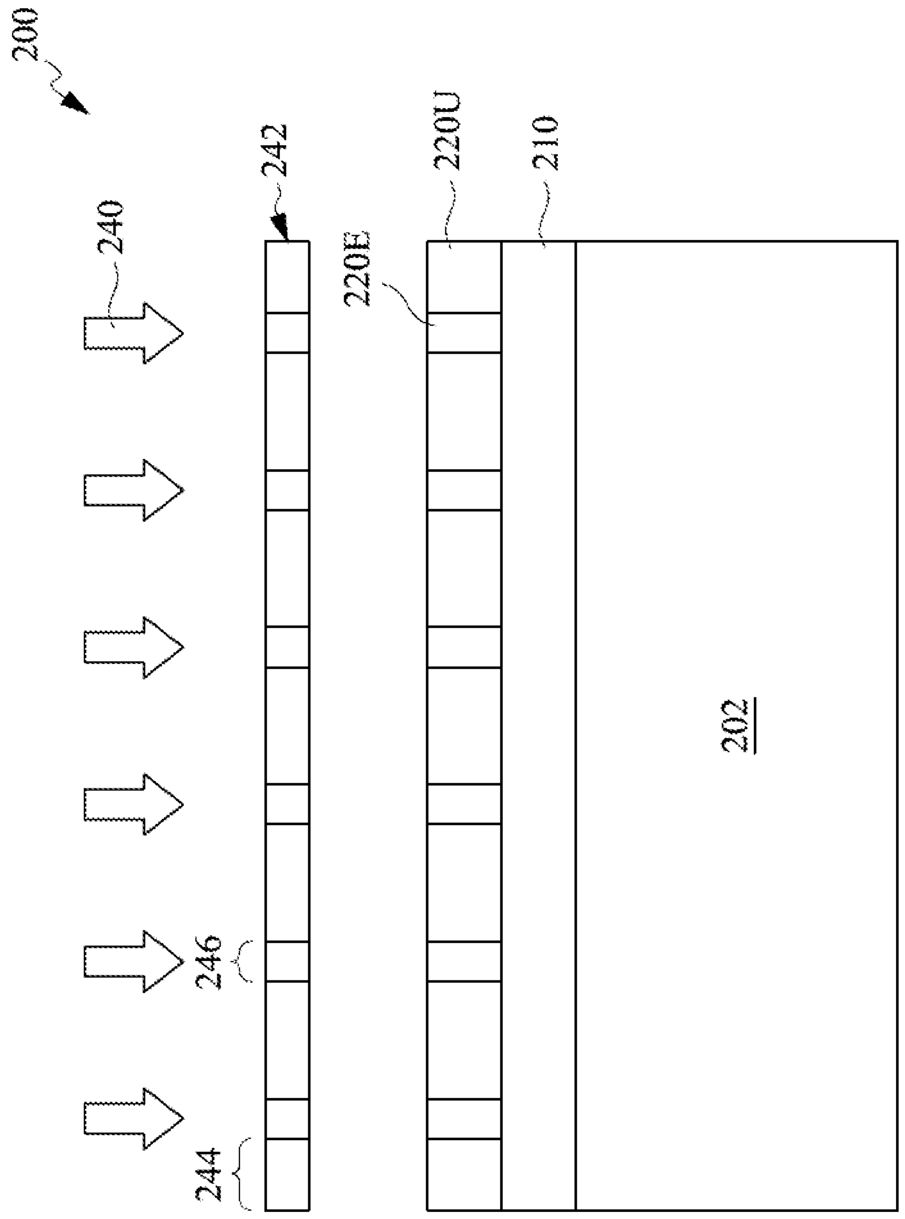

Referring to FIGS. 1 and 2D, the method 100 proceeds to operation 108, in which the photoresist layer 220 is selectively exposed to radiation 240, forming exposed regions 220E and unexposed regions 220U, in accordance with some embodiments. FIG. 2D is a cross-sectional view of the semiconductor device 200 after selectively exposure of the photoresist layer 220 to radiation 240, in accordance with some embodiments.

In some embodiments, the exposure to radiation 240 is carried out by placing the photoresist-coated substrate into a photolithography tool. The photolithography tool includes a photomask 242, optics, an exposure radiation source to provide the radiation 240, and a movable stage for supporting and moving the photoresist-coated substrate under the radiation 240. In some embodiments, the radiation 240 is an EUV radiation (e.g., 13.5 nm). Alternatively, in some embodiments, the radiation 240 is an e-beam radiation. In some embodiments, operation 108 is performed in a liquid (immersion lithography) or in a vacuum for EUV or e-beam lithography.

During the exposure process, the radiation source (not shown) supplies radiation 240, such as EUV or e-beam radiation, to the photoresist layer 220 through the photomask 242. The photomask 242 has a predefined pattern designed for an IC, based on a specification of the IC to be manufactured. The patterns of the photomask 242 correspond to patterns of materials that make up the various components of the IC device to be fabricated. For example, a portion of the IC design layout includes various IC features, such as an active region, gate electrode, source and drain, metal lines or vias of an interlayer interconnection, and openings for bonding pads, to be formed in the substrate 202 and/or the material layer 210 disposed on the substrate 202.

In some embodiments, the photomask 242 includes first regions 244 and second regions 246. In the first regions 244, the radiation 240 is blocked by the photomask 242 to reach the photoresist layer 220, while in the second regions 246, the radiation 240 is not blocked by the photomask 242 and can pass through the photomask 242 to reach the photoresist layer 220. As a result, portions of the photoresist layer 220 below the second regions 246 receive the radiation 240 and thus constitute the exposed regions 220E, while portions of the photoresist layer 220 below the first regions 244 do not receive the radiation 240, and thus constitute the unexposed regions 220U.

Upon radiation, the acid generator ligand in the exposed regions 220E of the photoresist layer 220 absorb the energy to generate an acid. The acid generated during the exposure to the radiation 240 functions as a catalyst to initiate the hydrolysis of the hydrolyzable ligands, thereby forming hydrolyzed organometallic compound containing hydroxyl (—OH) groups in the exposed regions 220E. The hydrolyzable ligands of the organometallic compound in the unexposed regions 220U are intact.

Figure 2E:
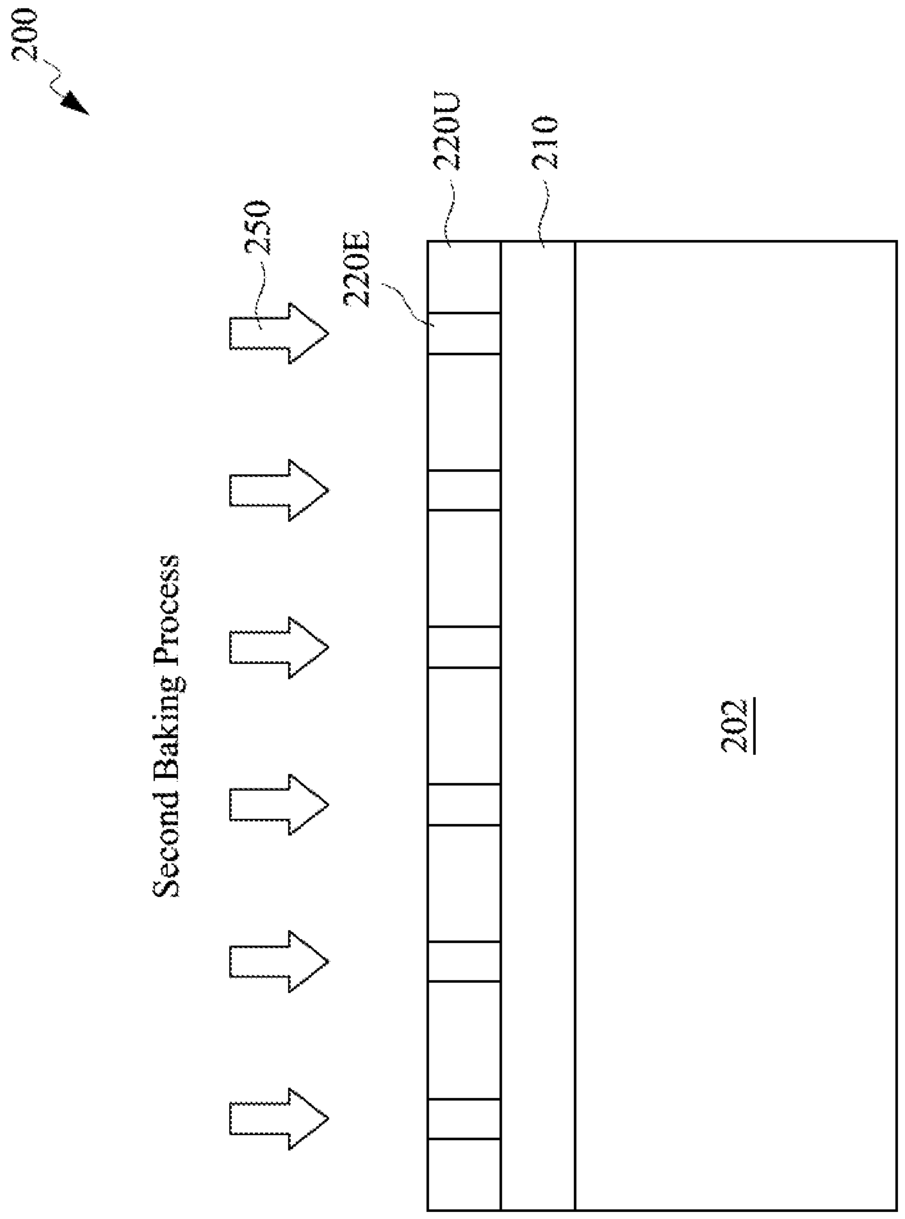

Referring to FIGS. 1 and 2E, the method 100 proceeds to operation 110, in which a second baking process 250 is performed, in accordance with some embodiments. FIG. 2E is a cross-sectional view of the semiconductor device 200 after performing the second baking process 250, in accordance with some embodiments.

Since this second baking process 250 is performed after the exposure process that exposes the photoresist layer 220 to radiation 240, the second baking process 250 may also be referred to as a post-exposure-baking (PEB) process. In some embodiments, the second baking process 250 is performed at temperatures ranging from about 50° C. to about 250° C., for a period of between about 20 seconds and about 5 minutes. In some embodiments, the second baking process is performed at temperatures ranging from about 100° C. to about 230° C. or from about 150° C. to about 200° C.

The second baking process 250 furthers the hydrolysis of the hydrolyzable ligands in the organometallic compounds as well as the condensation reaction between the hydroxyl groups of hydrolyzed organometallic compound, which generates chemical differences between the exposed regions 220E and the unexposed regions 220U within the photoresist layer 220. The chemical differences also cause differences in the solubility between the exposed regions 220E and the unexposed regions 220U.

As a result of hydrolysis and polycondensation of the hydrolyzable ligands in the organometallic compound of formula (I), a polymeric metal oxide is formed. In some embodiments, the polymeric metal oxide has the following structure (II):

$$[M(O)_x(G)_y]_n \quad \text{(II)},$$

wherein:

M is a metal element;

G is a photoacid generator ligand;

x and y are each independently an integer of 1 or greater, provided that x+y=v, wherein v is the valency of M; and n is greater than 2, such as 2 to 1000.

M and G are defined above in organometallic compound of formula (I). In some embodiments, M is Sn, y is 1, and n is 1. Accordingly, the polymeric metal oxide of formula (II) has one of the following structures:

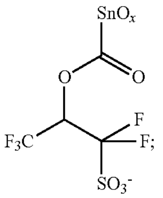

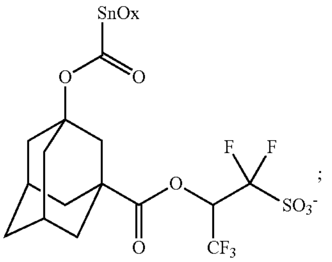

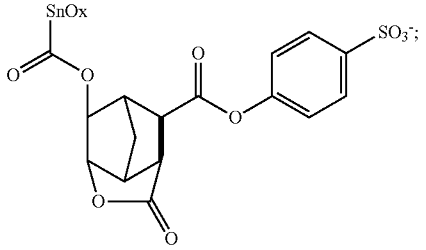

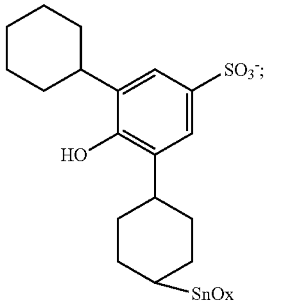

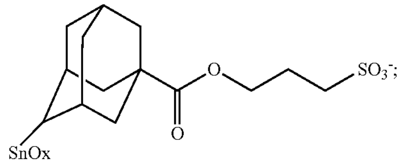

-continued

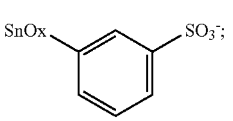

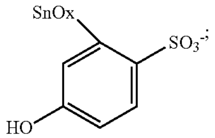

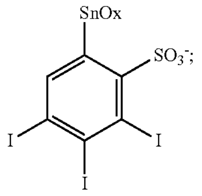

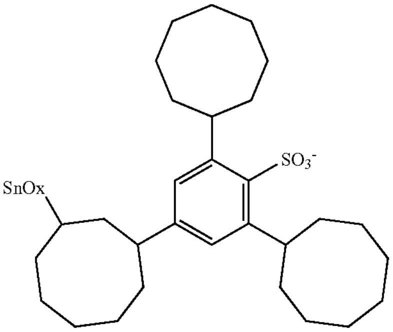

;

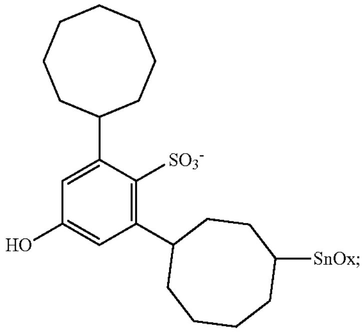

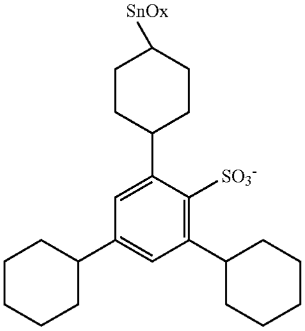

;

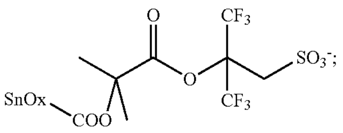

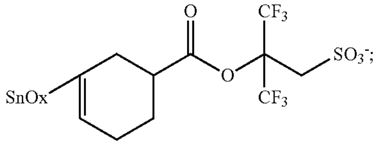

-continued
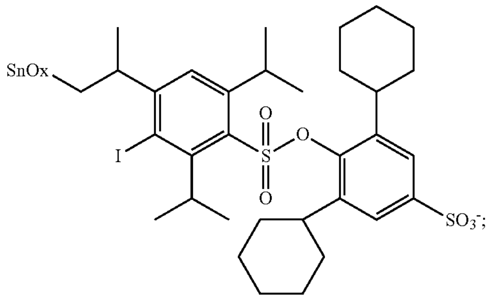
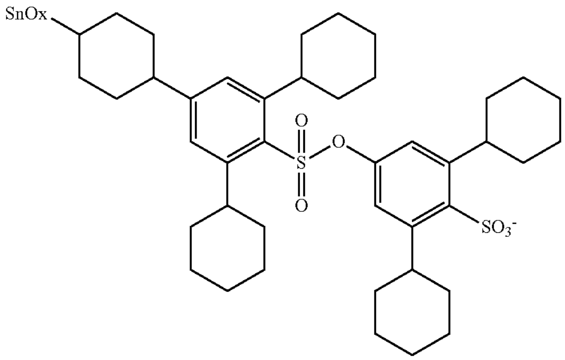
;
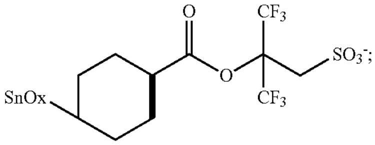
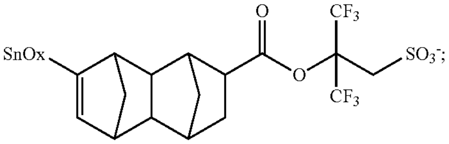
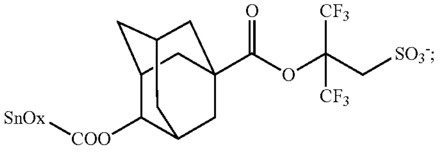
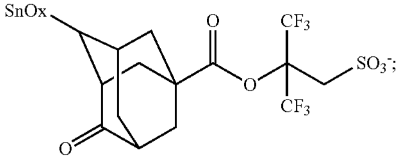
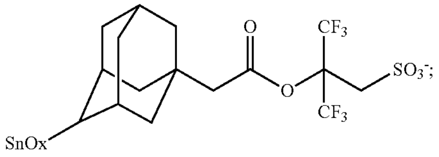
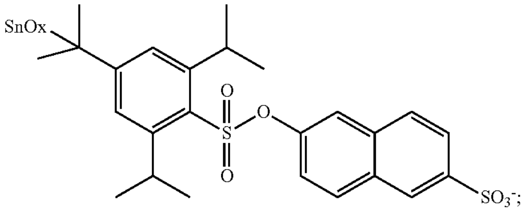
-continued
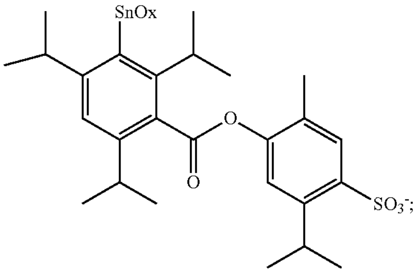
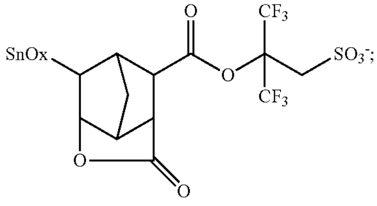
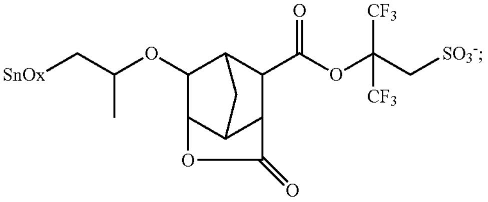
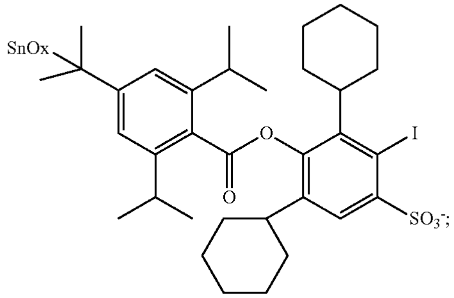
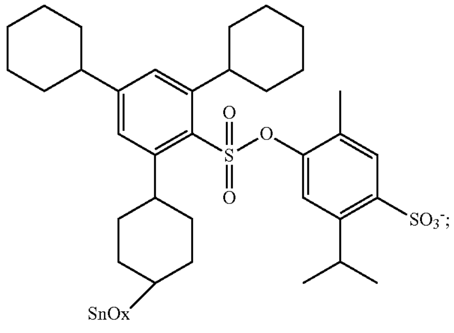
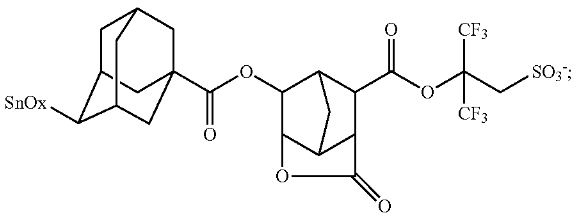

-continued
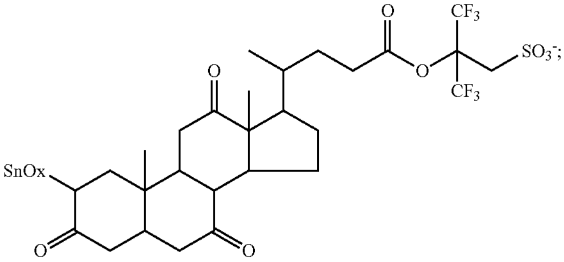
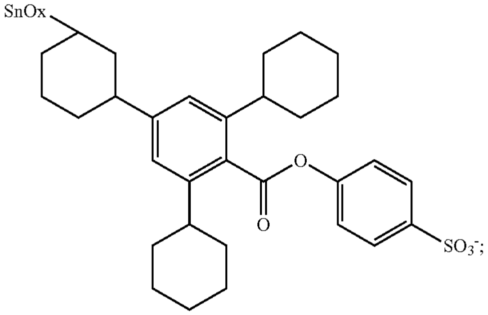
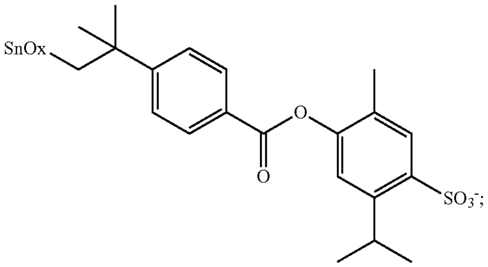
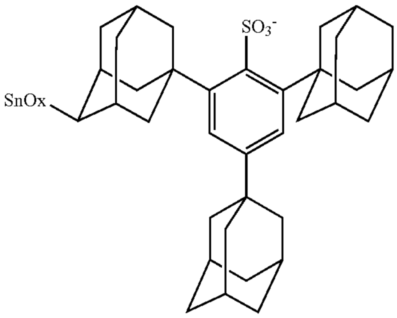
;
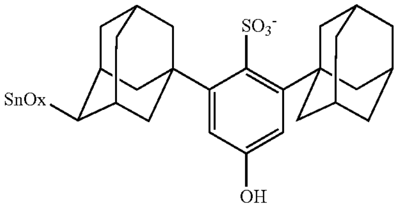
;
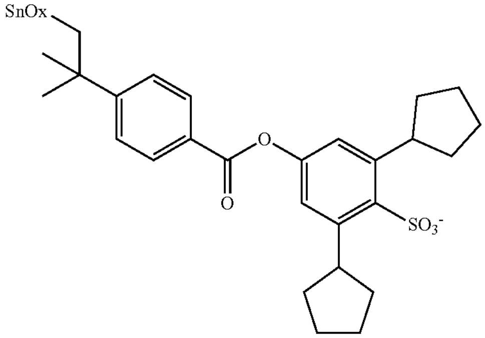
;
-continued
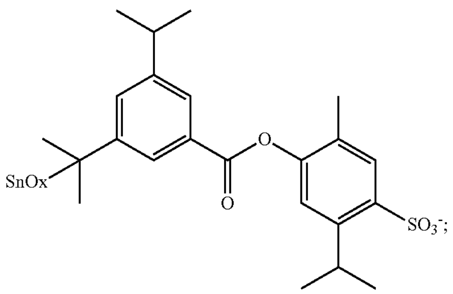
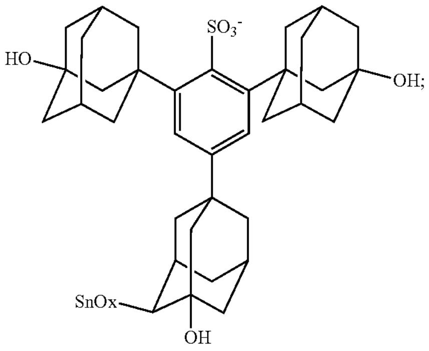
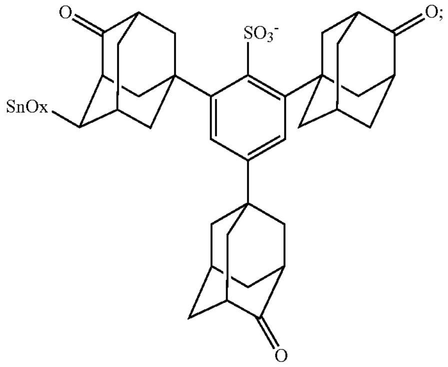
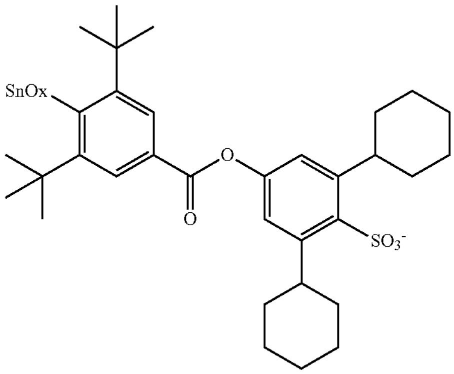
;

-continued
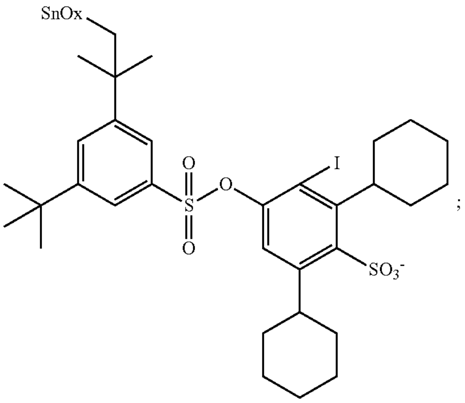
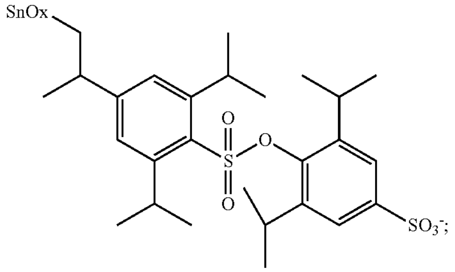
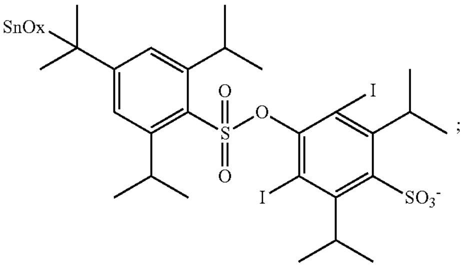
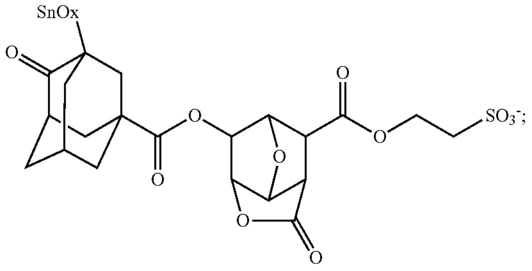
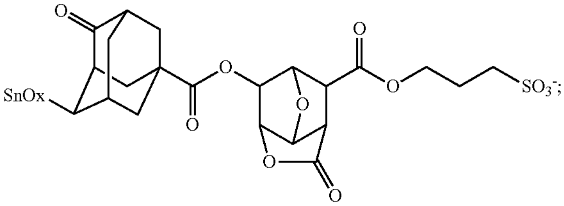
-continued
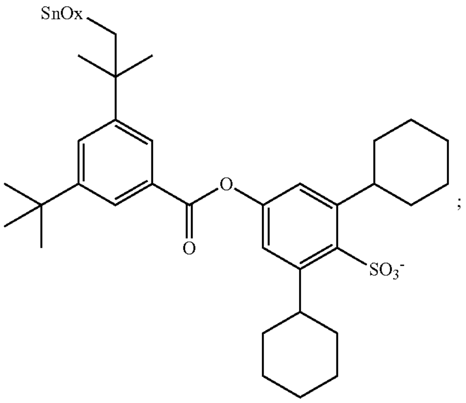
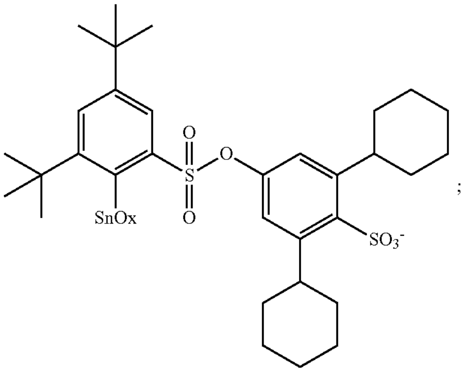
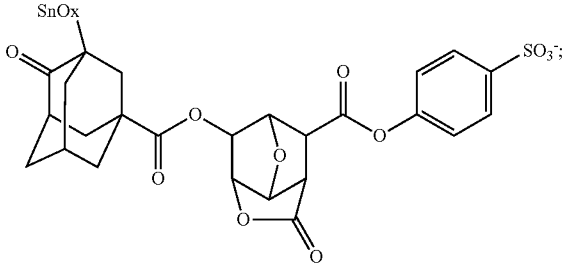
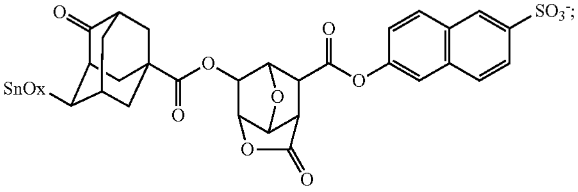
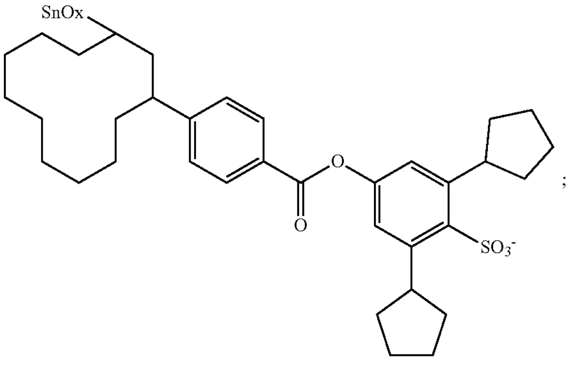

-continued

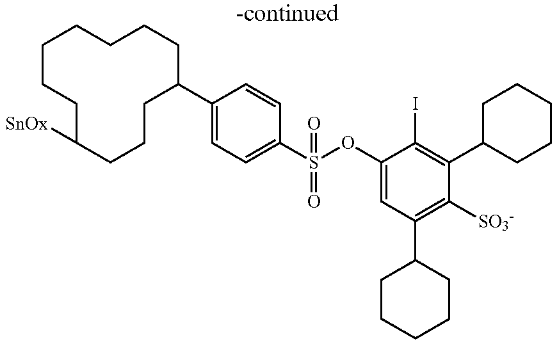

;

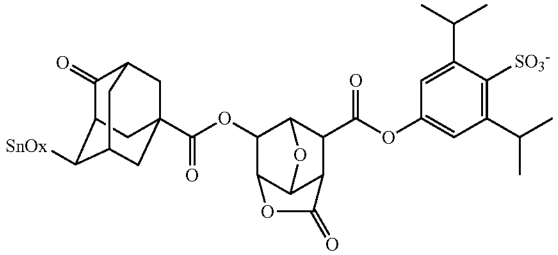

;

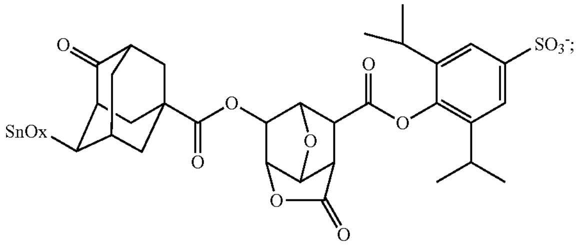

;

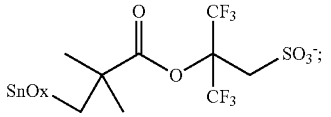

;

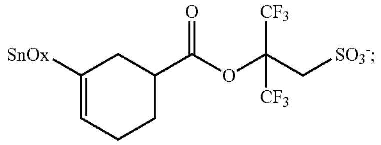

;

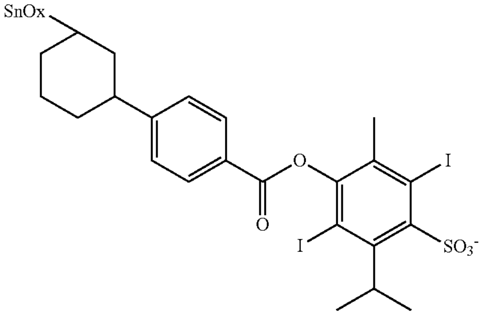

or

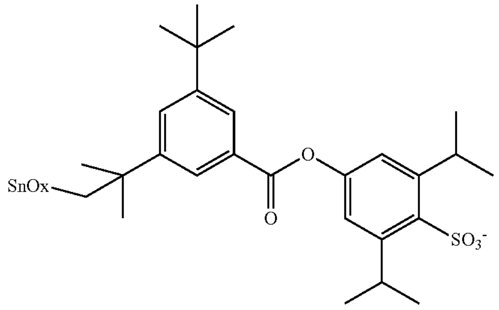

.

Figure 4:
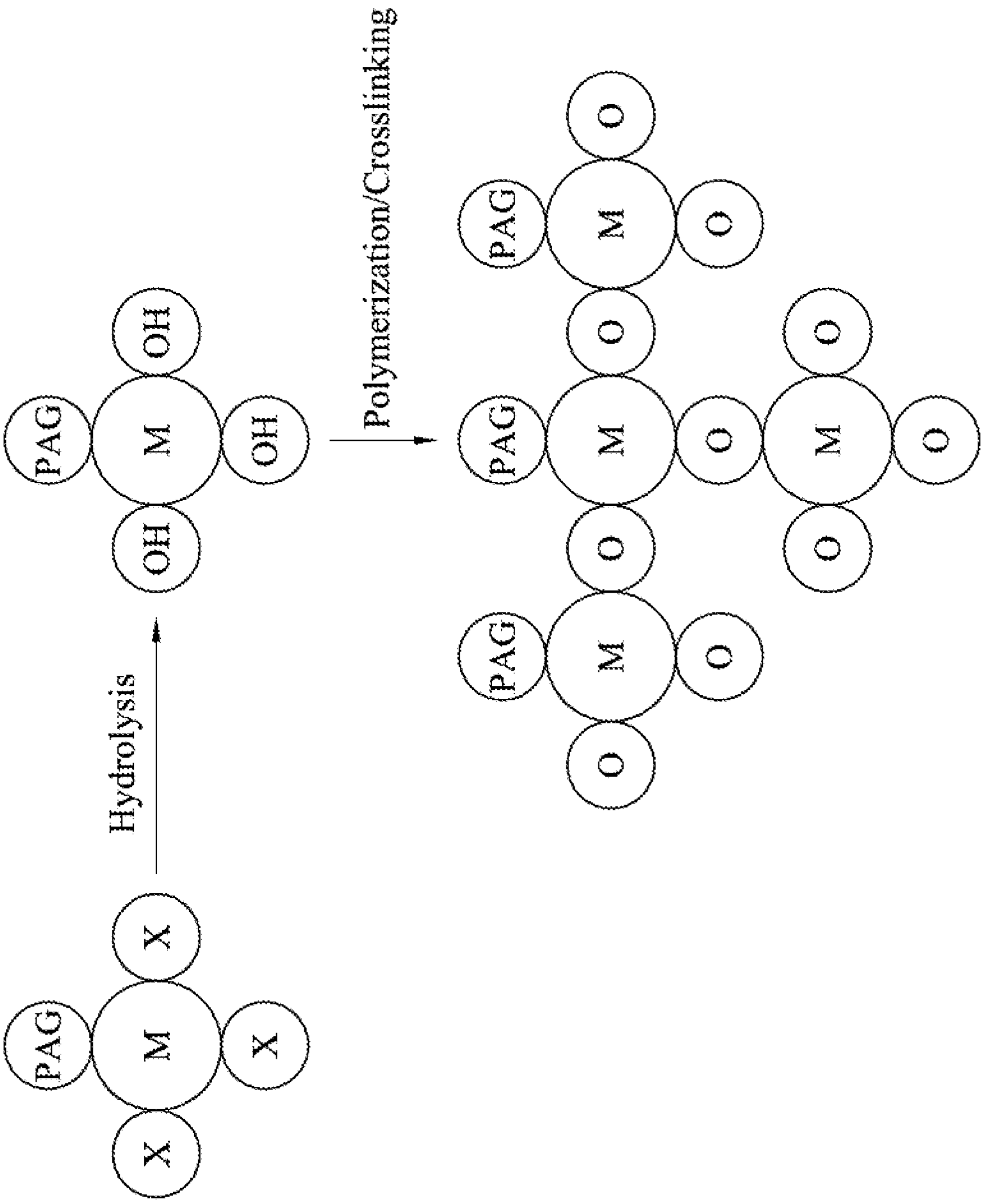
FIG. 4 illustrates an exemplary reaction scheme of hydrolysis and polycondensation of organometallic compounds in the presence of acid, in accordance with some embodiments.

FIG. 4 illustrate a reaction scheme that organometallic compounds of formula (I) undergo hydrolysis and subsequent polycondensation to form a polymeric metal oxide of formula (II), in accordance with embodiments of the present disclosure. Upon exposure to radiation, the photoacid generator ligand Q in organometallic compound of formula (I) absorbs radiation energy to generate an acid. The acid attacks hydrolyzable ligands Q in organometallic compound of formula (I) to initiate the hydrolysis of the hydrolyzable ligands Q. Upon heating, the hydrolyzed organometallic compounds undergo a polycondensation reaction to form the polymeric metal oxide of formula (II).

Figure 2F:
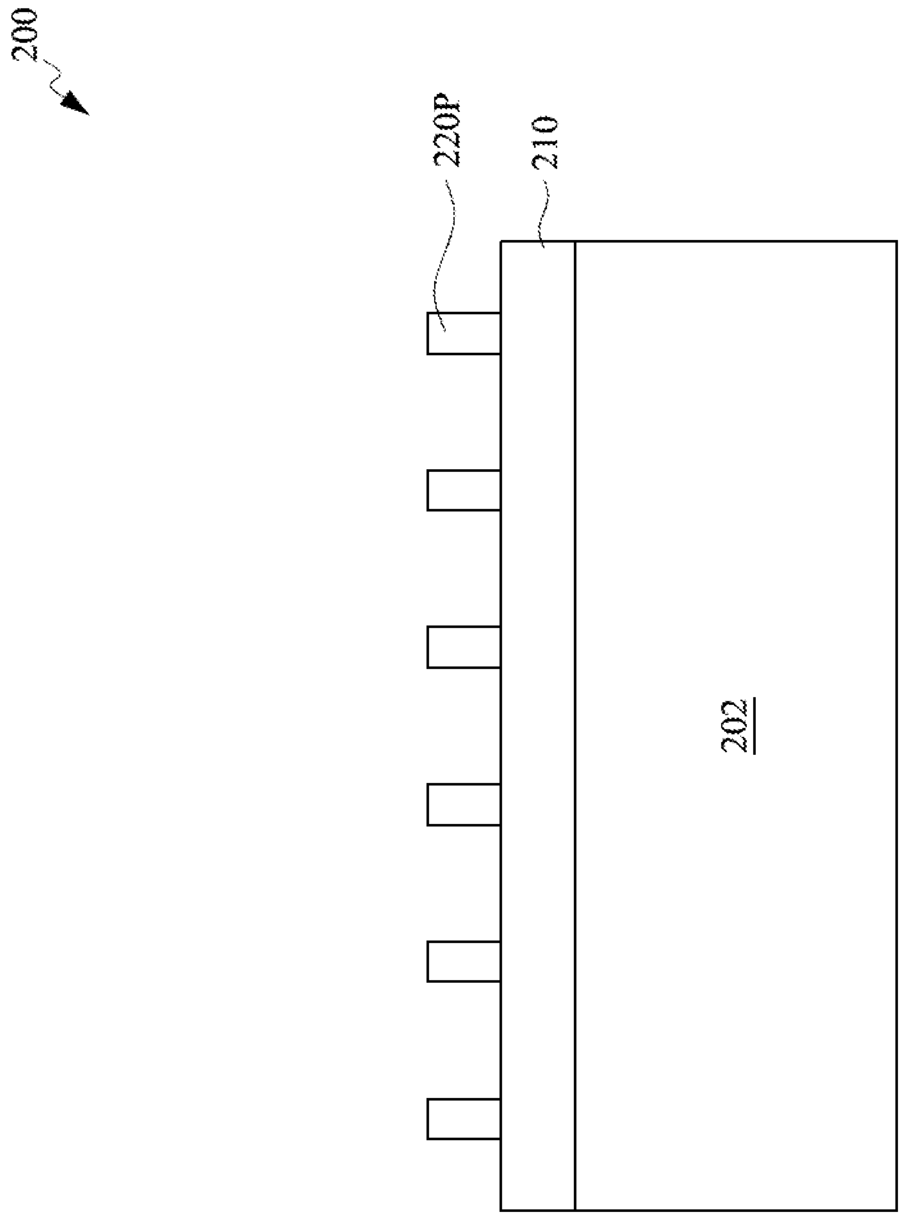

Referring to FIGS. 1 and 2F, the method 100 proceeds to operation 112, in which the photoresist layer 220 is developed to form a patterned photoresist layer 220P, in accordance with some embodiments. FIG. 2F is a cross-sectional view of the semiconductor device 200 after developing the photoresist layer 220 to form the patterned photoresist layer 220P, in accordance with some embodiments.

In some embodiments, a developer is applied to the photoresist layer 220. The developer may remove the exposed or unexposed regions depending on the resist type. If the photoresist layer 220 comprises a negative-type resist, the exposed regions are not dissolved by the developer and remain over the substrate 202. If the photoresist layer 220 includes a positive-type resist, the exposed regions would be dissolved by a positive-tone developer, leaving the unexposed regions over the substrate 202. The remaining exposed regions (or unexposed regions) define a pattern in the photoresist layer. In embodiments of the present disclosure, the developer dissolves the unexposed regions 220U of the photoresist layer 220, leaving behind the exposed regions 220E. After the developing process, the patterned photoresist layer 220P including the exposed regions 220E of the photoresist layer 220 is formed.

In some embodiments, the developer is applied to the photoresist layer 220 using a spin coating process. In the spin coating process, the developer is applied to the photoresist layer 220 from above the photoresist layer 220 while the photoresist-coated substrate 202 is rotated. In some embodiments, the developer is supplied at a rate of between about 5 ml/min and about 800 ml/min, while the photoresist-coated substrate 202 is rotated at a speed of between about 100 rpm and about 2000 rpm. In some embodiments, the developer is applied at a temperature of between about 10° C. and about 80° C. The operation 112 continues for between about 30 seconds to about 10 minutes in some embodiments.

In some embodiments, the developer includes an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol, propylene glycol ethyl ether (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

While the spin coating operation is one suitable method for developing the photoresist layer 220 after exposure, it is intended to be illustrative and is not intended to limit the embodiment. Rather, any suitable operations, including dip processes, puddle processes, and spray-on methods, may alternatively be used to develop the photoresist layer 220. All such development operations are included within the scope of the embodiments.

Figure 2G:
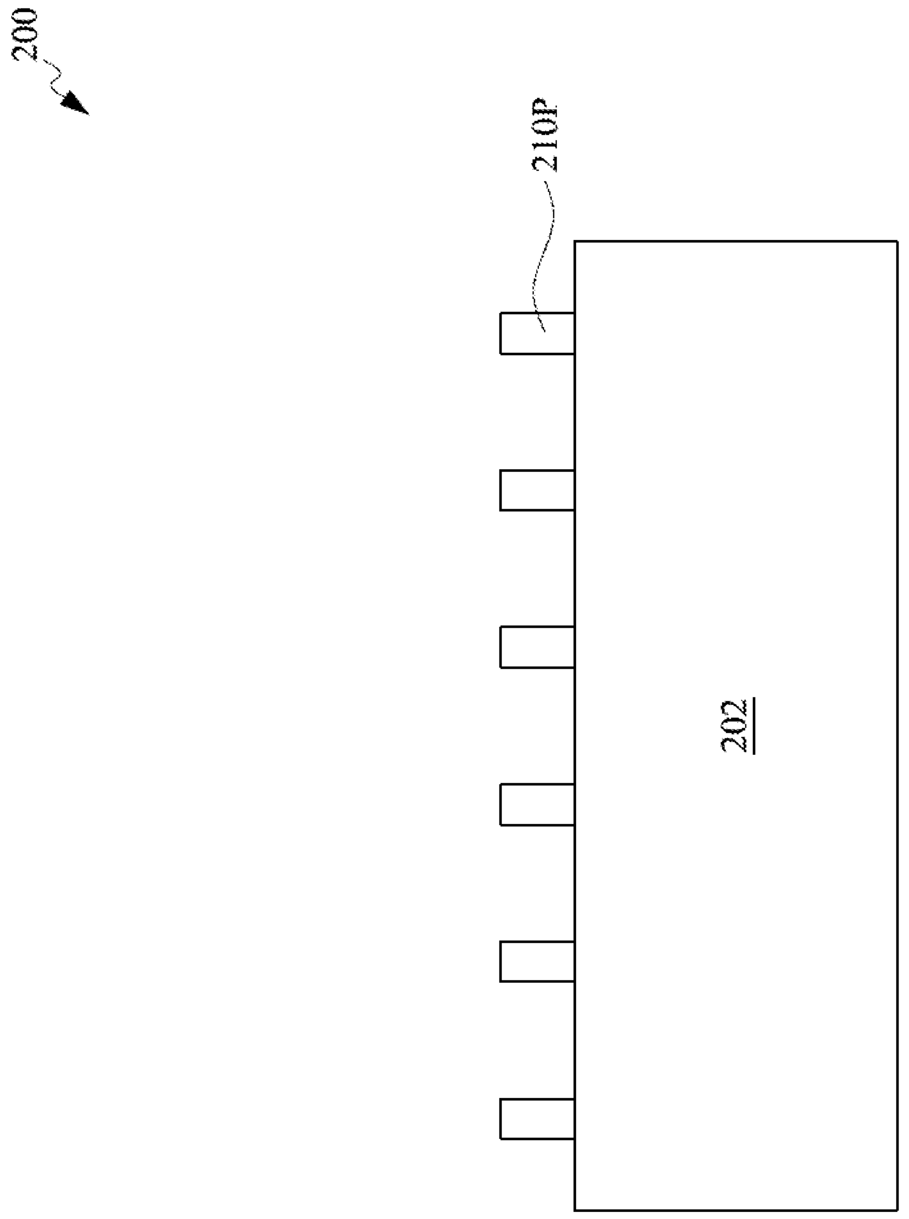

Referring to FIGS. 1 and 2G, the method 100 proceeds to operation 114, in which the material layer 210 is etched using the patterned photoresist layer 220P as an etch mask, in accordance with some embodiments. FIG. 2G is a cross-sectional view of the semiconductor device 200 after etching the material layer 210 using the patterned photoresist layer 220P as an etch mask, in accordance with some embodiments.

As shown in FIG. 2F, the material layer 210 is patterned, using the patterned photoresist layer 220P as an etch mask, to form a patterned material layer 210P.

An etching process may be performed to transfer the pattern in the patterned photoresist layer 220P to the material layer 210. In some embodiments, the etching process employed is an anisotropic etch such as a dry etch although any suitable etch process may be utilized. In some embodiments, the dry etch is a reactive ion etch (RIE) or a plasma etch. In some embodiments, the dry etch is implemented by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some embodiments, an oxygen plasma is performed to etch the material layer 210. In some embodiments, the anisotropic etch is performed at a temperature from about 250° C. to 450° C. for a duration from about 20 seconds to about 300 seconds.

If not completely consumed in the etching process, after formation of the patterned material layer 210P, the patterned photoresist layer 220P is removed, for example, by plasma ashing or wet stripping.

One aspect of this description relates to a method for forming a semiconductor device. The method included forming a photoresist layer comprising an organometallic compound over a substrate, selectively exposing the photoresist layer to radiation, and developing the photoresist layer to form a pattern in the photoresist layer. The organometallic compound comprises a metal core, at least one hydrolyzable ligand bonded to the metal core, and at least one photoacid generator ligand bonded to the metal core.

Another aspect of this description relates to a method for forming a semiconductor structure. The method includes depositing a material layer over a substrate, forming a photoresist layer over the material layer, exposing the photoresist layer to a lithography radiation to define an exposed region and an unexposed region thereof, baking the photoresist layer, and developing the exposed region or unexposed region of the photoresist layer to form a patterned photoresist layer. The photoresist layer comprises an organometallic compound having a metal core and at least two different types of ligands bonded to the metal core. A first type of the ligands comprises a photoacid generator operable to generate an acid in response to a lithography radiation, and a second type of the ligands comprises an acid hydrolyzable group operable to hydrolyze to provide an hydroxy group in a presence of the acid generated by the photoacid generator.

Still another aspect of this description relates to a photoresist composition including an organometallic compound having the following formula (I):

$$(Q)_x\text{—}M_z\text{—}(L\text{—}G)_y, \tag{I}$$

wherein:

M is, at each occurrence, a metal element;

Q is, at each occurrence, a hydrolyzable ligand;

G is, at each occurrence, a photoacid generator ligand;

L is, at each occurrence, an optional alkylene, alkenylene, alkynylene, cycloalkylene, arylene, heteroalkylene, heteroalkenylene, heteroalkynylene, heteroarylene or heteroatomic linker;

z is an integer of 1 or greater; and x and y are each independently an integer of 1 or greater, provided that x+y≤v, wherein v is the valency of M.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

forming a photoresist layer comprising an organometallic compound over a substrate, wherein the organometallic compound having the following formula (I):

$$(Q)_x\text{—}M_z\text{—}(L\text{—}G)_y, \tag{I}$$

wherein:

M is a metal core;

Q is, at each occurrence, a hydrolyzable ligand;

G is, at each occurrence, a photoacid generator ligand;

L is, at each occurrence, an optional alkylene, alkenylene, alkynylene, cycloalkylene, arylene, heteroalkylene, heteroalkenylene, heteroalkynylene, heteroarylene or heteroatomic linker;

z is an integer of 1 or greater; and x and y are each independently an integer of 1 or greater, provided that x+y≤v, wherein v is the valency of M;

selectively exposing the photoresist layer to radiation, wherein the exposure generates an acid from the photoacid generator ligand, and the acid causes complete hydrolysis of the hydrolyzable ligand to form a hydrolyzed organometallic compound in exposed regions of the photoresist layer;

baking the photoresist layer to induce condensation between the hydroxy groups of the hydrolyzed organometallic compound; and developing the photoresist layer to form a pattern in the photoresist layer.

2. The method of claim 1, wherein the radiation is an electron beam or extreme ultraviolet radiation.

3. The method of claim 1, wherein the metal core comprises a metal having an absorption at extreme ultraviolet wavelengths of at least 4 $cm^2/mol$.

4. The method of claim 3, wherein the metal is selected from tin (Sn), hafnium (Hf), zirconium (Zr), silver (Ag), cadmium (Cd), indium (In), antimony (Sb), tellurium (Te), caesium (Cs), gold (Au), barium (Ba), thallium (Tl), bismuth (Bi) and cerium (Ce).

5. The method of claim 1, wherein z is an integer from 1 to 18, and wherein the metal core comprises from 1 to 18 metal ions.

6. The method of claim 1, wherein a molar concentration of the at least one photoacid generator ligand to the metal core is from about 0.01 mol % to 30 mol %.

7. The method of claim 1, wherein the hydrolyzable ligand comprises halogen, alkoxy, acyloxy or carboxyl.

8. The method of claim 1, wherein the photoacid generator ligand comprises an onium salt, a selenium salt, a phosphonium salt, iodinium, a sulfonium salt, an organic halogen compound, an O-nitrobenzylsulfonate compound, an N-iminosulfonate compound, an N-imidosulfonate compound, a diazosulfonate compound, a sulfonamide compound, a diazodisulfonate compound, or a disulfone compound.

9. The method of claim 1, wherein forming the photoresist layer comprises spin coating a photoresist composition comprising the organometallic compound and a solvent on the substrate.

10. The method of claim 1, further comprising after the exposing, baking the photoresist layer to crosslink an exposed region of the photoresist layer.

11. A method for forming a semiconductor device, comprising:

depositing a material layer over a substrate;

forming a photoresist layer over the material layer, wherein the photoresist layer comprises an organometallic compound, the organometallic compound having the following formula (I):

$$(Q)_x - M_z - (L - G)_y, \tag{I}$$

wherein:

M is a metal core;

Q is, at each occurrence, a hydrolyzable ligand;

G is, at each occurrence, a photoacid generator ligand;

L is, at each occurrence, an optional alkylene, alkenylene, alkynylene, cycloalkylene, arylene, heteroalkylene, heteroalkenylene, heteroalkynylene, heteroarylene or heteroatomic linker;

z is an integer of 1 or greater; and x and y are each independently an integer of 1 or greater, provided that x+y≤v, wherein v is the valency of M;

exposing the photoresist layer to a lithography radiation to define an exposed region and an unexposed region thereof, wherein the exposure generates an acid from the photoacid generator ligand, and the acid causes complete hydrolysis of the hydrolyzable ligand to form a hydrolyzed organometallic compound in the exposed region of the photoresist layer;

baking the photoresist layer to induce condensation between the hydroxy groups of the hydrolyzed organometallic compound; and developing the exposed region or unexposed region of the photoresist layer to form a patterned photoresist layer.

12. The method of claim 11, wherein the photoacid generator ligand is derived from a photoacid generator comprising an onium salt, a selenium salt, a phosphonium salt, iodinium, a sulfonium salt, an organic halogen compound, an O-nitrobenzylsulfonate compound, an N-iminosulfonate compound, an N-imidosulfonate compound, a diazosulfonate compound, a sulfonamide compound, a diazodisulfonate compound, or a disulfone compound.

13. The method of claim 11, wherein the metal core comprises one or more ions of a metal selected from tin (Sn), hafnium (Hf), zirconium (Zr), silver (Ag), cadmium (Cd), indium (In), antimony (Sb), tellurium (Te), caesium (Cs), gold (Au), barium (Ba), thallium (Tl), bismuth (Bi) and cerium (Ce).

14. The method of claim 11, wherein the acid hydrolyzable group comprises methoxy, ethoxy, propoxy, isopropoxy, butoxy, isobutoxy, tert-butoxy, pentyloxy, tert-pentyloxy, neo-pentyloxy, hexyloxy, isohexyloxy, phenoxy, tolyloxy, xylyloxy or acetoxy.

15. The method of claim 11, wherein forming the photoresist layer comprises depositing the organometallic compound by CVD, PVD or ALD.

16. The method of claim 11, further comprising etching the material layer using the patterned photoresist layer as an etch mask.

17. A photoresist composition comprising an organometallic compound having the following formula (I):

$$(Q)_x - M_z - (L - G)_y, \tag{I}$$

wherein:

M is, at each occurrence, a metal element;

Q is, at each occurrence, a hydrolyzable ligand;

G is, at each occurrence, a photoacid generator ligand;

L is, at each occurrence, an optional alkylene, alkenylene, alkynylene, cycloalkylene, arylene, heteroalkylene, heteroalkenylene, heteroalkynylene, heteroarylene or heteroatomic linker;

z is an integer of 1 or greater; and x and y are each independently an integer of 1 or greater, provided that x+y≤v, wherein v is the valency of M.

18. The photoresist composition of claim 17, wherein M comprises tin (Sn), hafnium (Hf), zirconium (Zr), silver (Ag), cadmium (Cd), indium (In), antimony (Sb), tellurium (Te), caesium (Cs), gold (Au), barium (Ba), thallium (TI), bismuth (Bi) or cerium (Ce).

19. The photoresist composition of claim 17, wherein Q is halogen, alkoxy, acyloxy or carboxyl.

20. The photoresist composition of claim 17, wherein G has one of the following structures:

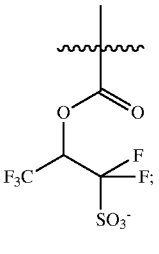

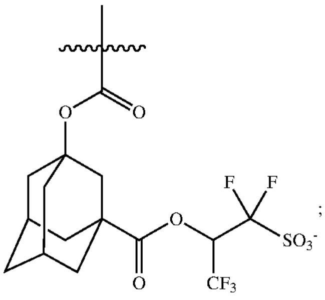

;

-continued
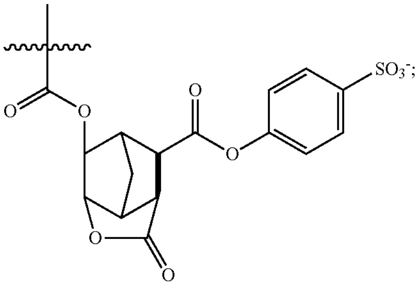
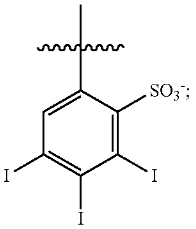
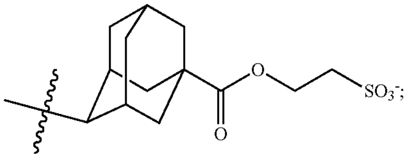
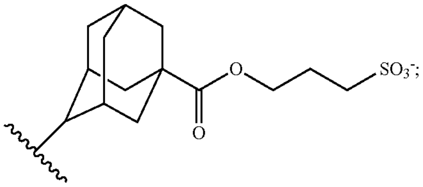
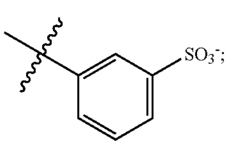
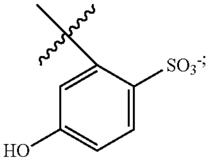
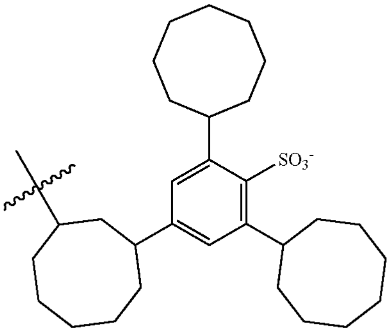
;
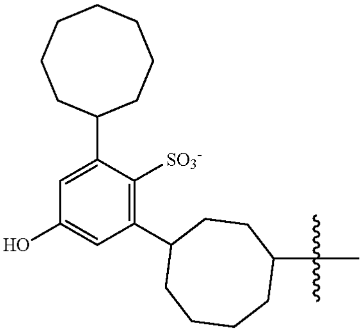
;
-continued
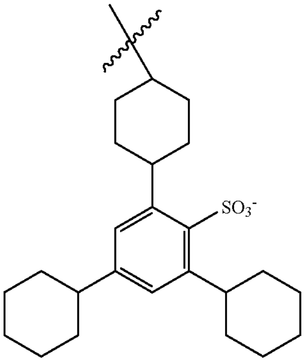
;
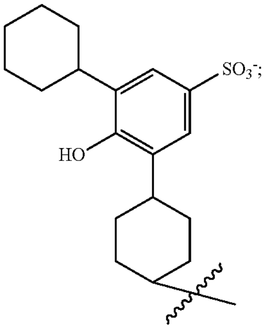
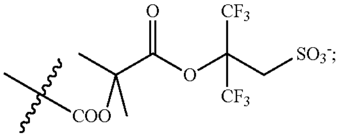
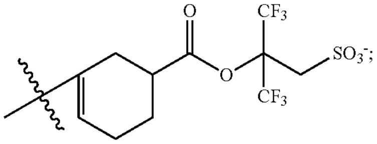
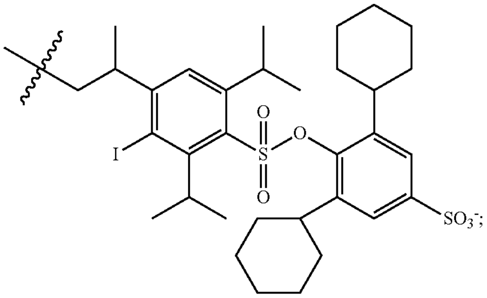
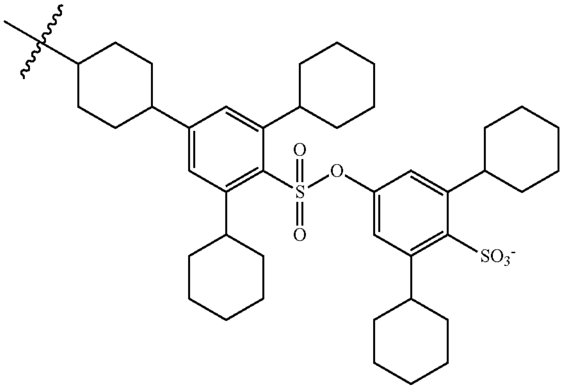
;

-continued
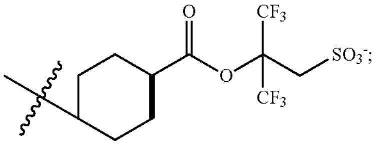
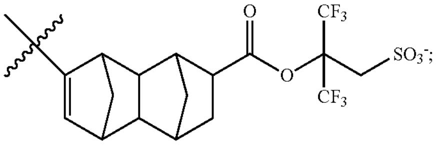
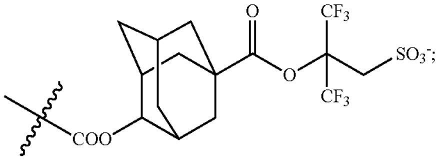
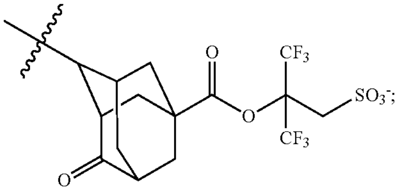
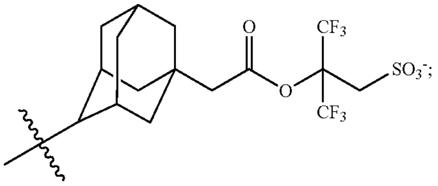
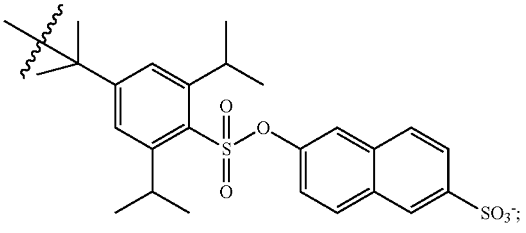
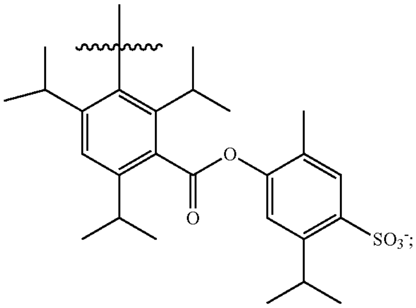
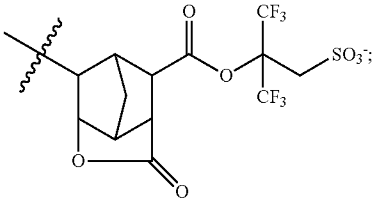
-continued
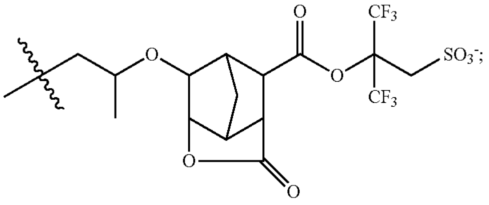
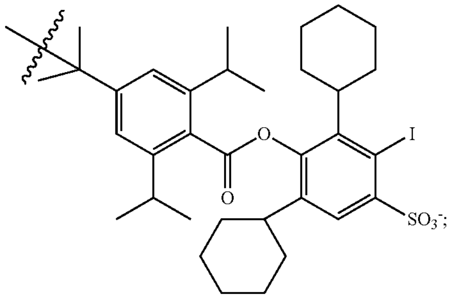
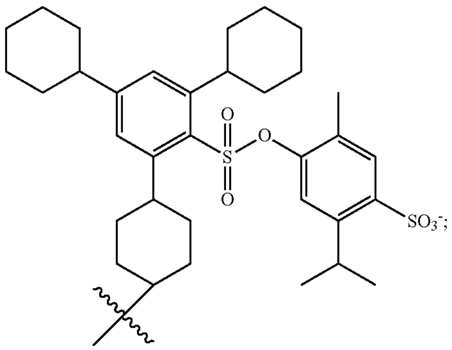
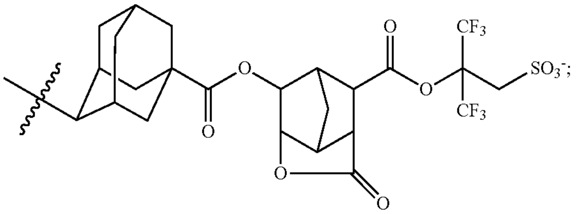
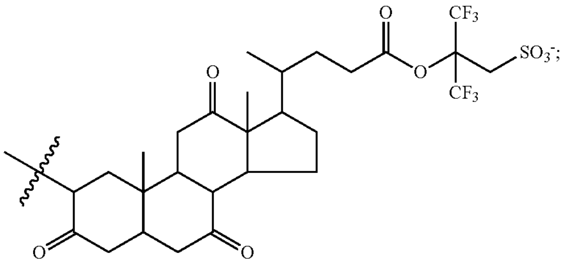
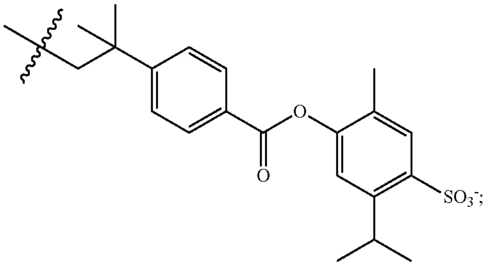

-continued
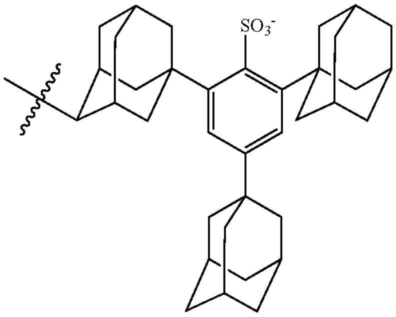
;
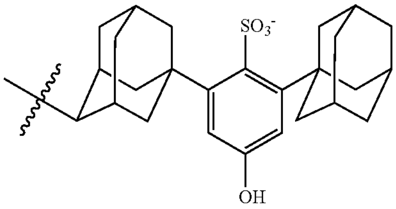
;
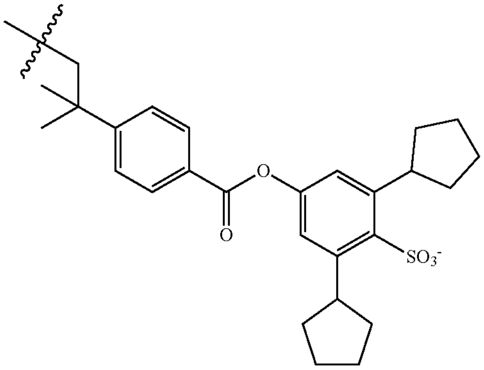
;
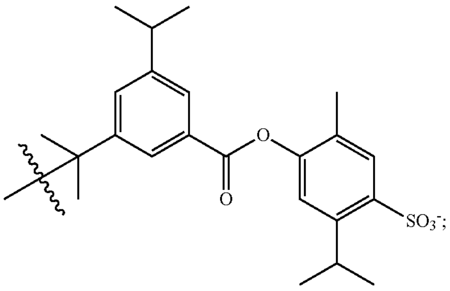
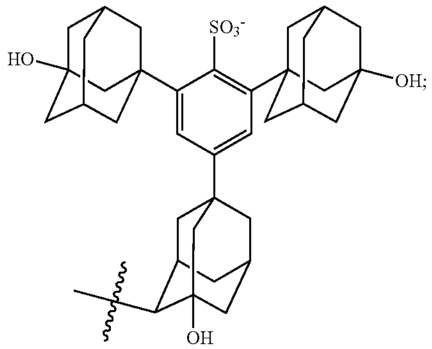
-continued
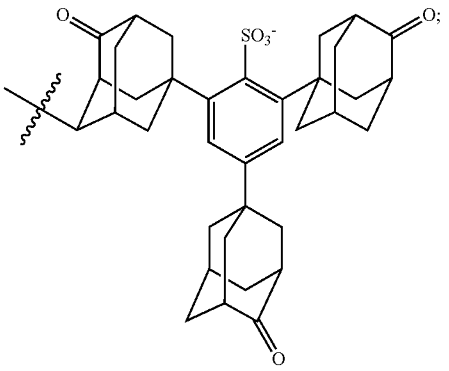
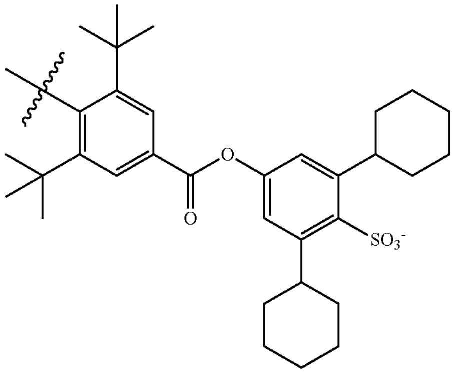
;
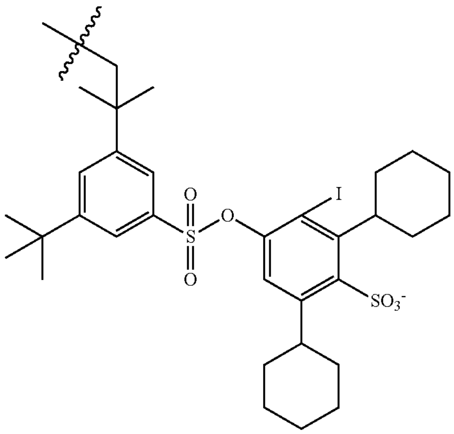
;
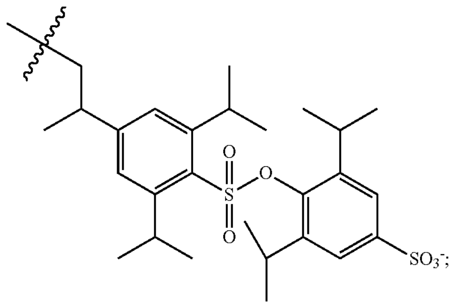

-continued
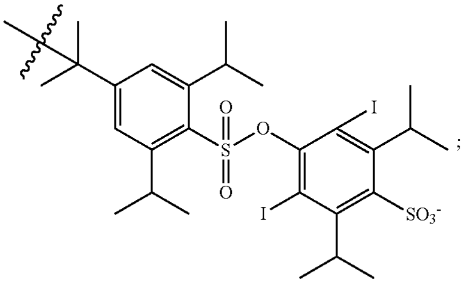
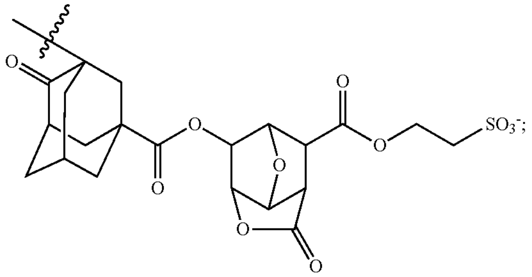
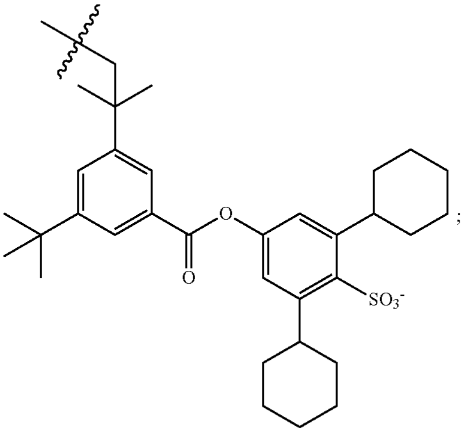
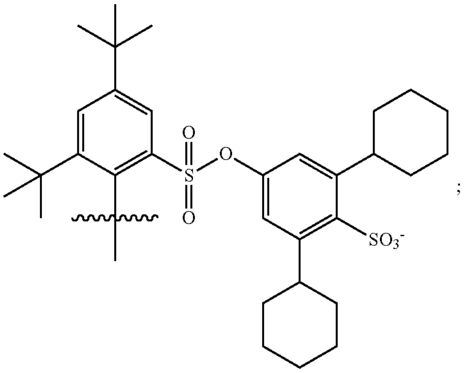
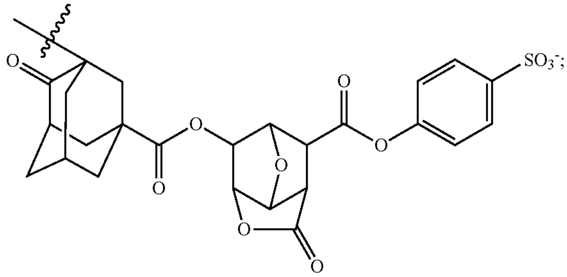
-continued
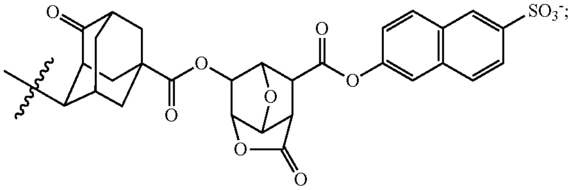
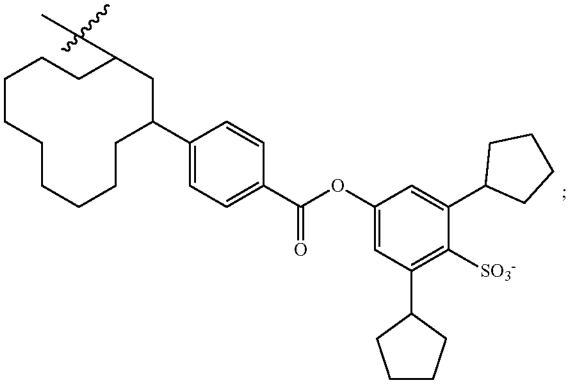
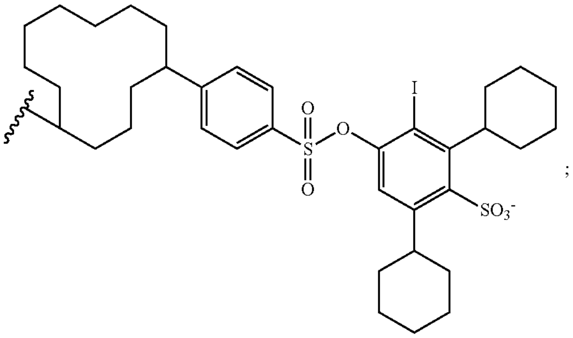
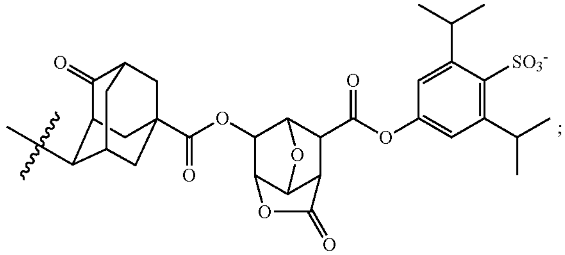
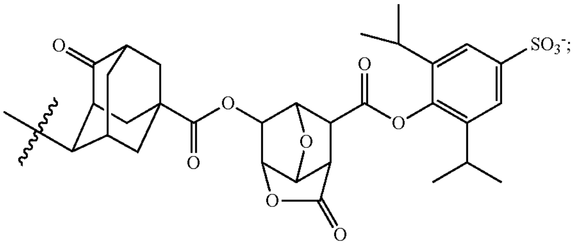
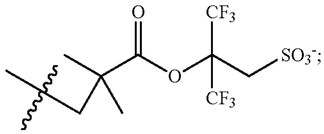
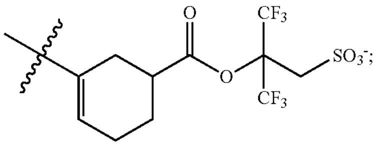

-continued
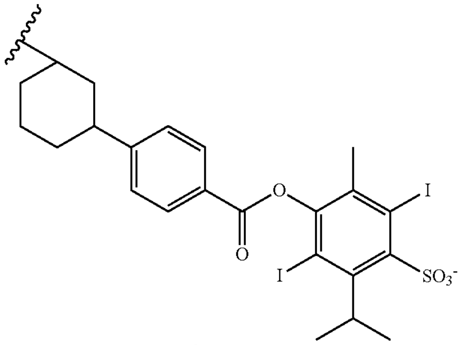
or
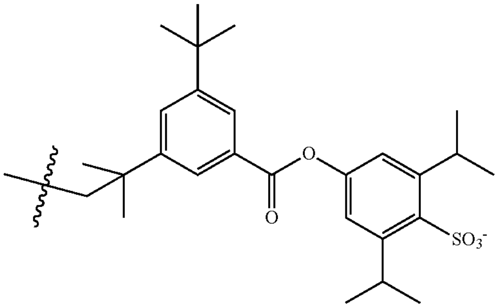
.
* * * * *